United States Patent
Nagai et al.

(10) Patent No.: US 11,935,775 B2
(45) Date of Patent: Mar. 19, 2024

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventors: Satoshi Nagai, Neyagawa (JP); Manabu Takakuwa, Tsu (JP); Satoshi Usui, Nagoya (JP)

(73) Assignee: Kioxia Corporation, Tokyo (JP)

( * ) Notice: Subject to any disclaimer, the term of this patent is extended or adjusted under 35 U.S.C. 154(b) by 623 days.

(21) Appl. No.: 17/117,979

(22) Filed: Dec. 10, 2020

(65) Prior Publication Data

US 2021/0296152 A1 Sep. 23, 2021

(30) Foreign Application Priority Data

Mar. 17, 2020 (JP) ................. 2020-046772

(51) Int. Cl.
*H01L 21/68* (2006.01)
*H01L 21/67* (2006.01)

(52) U.S. Cl.
CPC ...... *H01L 21/681* (2013.01); *H01L 21/67092* (2013.01); *H01L 21/67242* (2013.01)

(58) Field of Classification Search
CPC . H01L 2224/81455; H01L 2224/81464; H01L 2224/81466; H01L 2224/81484; H01L 2224/82005; H01L 2224/821; H01L 2224/82106; H01L 2224/8213; H01L 2224/82132; H01L 2224/83136; H01L 2224/83385; H01L 2224/83851; H01L 2224/83986; H01L 2224/8546; H01L 2224/9205; H01L 2224/95085; H01L 2224/95122; H01L 2224/95136;
(Continued)

(56) References Cited

U.S. PATENT DOCUMENTS

2009/0059323 A1    3/2009  Ido
2013/0148878 A1*   6/2013  Lin ...................... G06T 7/33
                                              382/151
(Continued)

FOREIGN PATENT DOCUMENTS

JP      9-257413 A    10/1997
JP     2012-7898 A     1/2012
(Continued)

*Primary Examiner* — Michael P Stafira
(74) *Attorney, Agent, or Firm* — Oblon, McClelland, Maier & Neustadt, L.L.P.

(57) ABSTRACT

According to one embodiment, there is provided a semiconductor manufacturing apparatus including a rotatable substrate stage, a first measuring mechanism and a second measuring mechanism. On the rotatable substrate stage, a laminated substrate used for manufacturing a semiconductor device is placed. The laminated substrate is formed by a first substrate and a second substrate to be laminated to each other. The first measuring mechanism measures an edge of the first substrate and an edge of the second substrate from a first direction. The second measuring mechanism measures the edge of the first substrate and the edge of the second substrate from a second direction. The second direction is a direction different from the first direction in an angle to a normal of the first substrate.

18 Claims, 16 Drawing Sheets

(58) Field of Classification Search
CPC . H01L 2225/06565; H01L 2225/06586; H01L 2225/1005; H01L 2225/1064; H01L 23/00; H01L 23/02; H01L 23/3171; H01L 23/4824; H01L 23/485; H01L 23/4951; H01L 23/49513; H01L 23/49562; H01L 23/5223; H01L 23/642; H01L 23/645; H01L 24/08; H01L 24/742; H01L 24/95; H01L 25/043; H01L 25/071; H01L 27/00; H01L 27/06; H01L 27/101; H01L 27/12; H01L 27/1222; H01L 27/1244; H01L 27/1248; H01L 27/1259; H01L 27/1262; H01L 27/127; H01L 27/1274; H01L 27/1277; H01L 27/1292; H01L 27/14; H01L 27/1443; H01L 27/14609; H01L 28/10; H01L 28/40; H01L 28/60; H01L 28/87; H01L 28/88; H01L 29/04; H01L 29/06; H01L 29/0653; H01L 29/0684; H01L 29/1606; H01L 29/42324; H01L 29/42328; H01L 29/4236; H01L 29/42364; H01L 29/49; H01L 29/66045; H01L 29/66477; H01L 29/6659; H01L 29/66659; H01L 29/66666; H01L 29/66772; H01L 29/6684; H01L 29/732; H01L 29/778; H01L 29/7827; H01L 29/7834; H01L 29/78391; H01L 29/7842; H01L 29/7848; H01L 29/78621; H01L 29/78666; H01L 29/7885; H01L 2924/0001; H01L 2924/01014; H01L 2924/01043; H01L 2924/01051; H01L 2924/01088; H01L 2924/01092; H01L 2924/01404; H01L 2924/05442; H01L 2924/10158; H01L 2924/12036; H01L 2924/1436; H01L 2924/1437; H01L 2924/14511; H01L 2924/15155; H01L 2924/15157; H01L 2924/1531; H01L 2924/15312; H01L 2924/15321; H01L 2924/157; H01L 2924/15793; H01L 2924/16235; H01L 2924/1816; H01L 2924/186; H01L 2924/19032; H01L 2924/2064; H01L 2933/0033; H01L 2933/005; H01L 2933/0091; H01L 31/02013; H01L 31/0203; H01L 31/022416; H01L 31/0232; H01L 31/056; H01L 31/073; H01L 31/1804; H01L 31/1896; H01L 33/00; H01L 33/06; H01L 33/30; H01L 33/387; H01L 33/48; H01L 33/508; H01L 33/52; H01L 33/54; G01N 2035/00881; G01N 2021/6419; G01N 21/6428; G01N 27/3271; G01N 33/558; G01N 2021/6421; G01N 2021/6441; G01N 2035/0436; G01N 35/026; G01N 2035/0425; G01N 33/487; G01N 1/02; G01N 1/38; G01N 2001/028; G01N 21/8483; G01N 33/15; G01N 27/3272; G01N 2203/0023; G01N 2203/0282; G01N 2203/0647; G01N 3/068; G01N 3/20; G01N 33/48728; G01N 15/1031; G01N 2035/00158; G01N 2333/705; G01N 27/44717; G01N 31/22

See application file for complete search history.

(56) References Cited

U.S. PATENT DOCUMENTS

2016/0148826 A1\* 5/2016 Thallner ............... B65G 47/26
                                                            414/781
2021/0327732 A1\* 10/2021 Luckner ........... H01L 21/67248

FOREIGN PATENT DOCUMENTS

| JP | 2013-74242 A | | 4/2013 | |
|---|---|---|---|---|
| JP | 2013-137295 A | | 7/2013 | |
| JP | 2015-102389 A | | 6/2015 | |
| JP | 2016-48744 A | | 4/2016 | |
| JP | 2017-108055 A | | 6/2017 | |
| KR | 20150023376 A | \* | 3/2015 | |
| WO | WO-2010023935 A1 | \* | 3/2010 | ....... H01L 21/67092 |
| WO | WO 2011/096239 A1 | | 8/2011 | |
| WO | WO-2014202106 A1 | \* | 12/2014 | ............. B65G 47/26 |
| WO | WO-2015082020 A1 | \* | 6/2015 | ......... G01R 31/2887 |
| WO | WO-2018166605 A1 | \* | 9/2018 | ......... B81C 1/00357 |

\* cited by examiner

SEMICONDUCTOR MANUFACTURING APPARATUS AND METHOD OF MANUFACTURING SEMICONDUCTOR DEVICE

CROSS-REFERENCE TO RELATED APPLICATIONS

This application is based upon and claims the benefit of priority from Japanese Patent Application No. 2020-046772, filed on Mar. 17, 2020; the entire contents of which are incorporated herein by reference.

FIELD

Embodiments described herein relate generally to a semiconductor manufacturing apparatus and a method of manufacturing a semiconductor device.

BACKGROUND

In order to manufacture a semiconductor device, a plurality of substrates may be laminated to form a laminated substrate. In this case, it is desirable to accurately determine the position of each substrate of the laminated substrate.

DETAILED DESCRIPTION

Figure 1A:
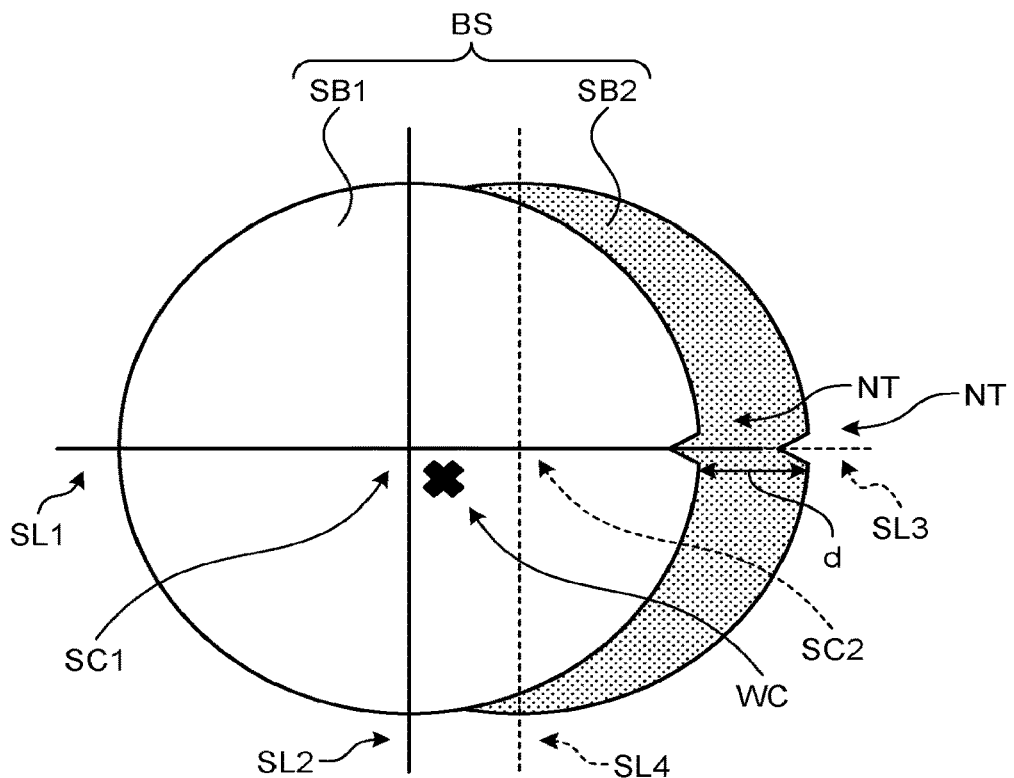
FIGS. 1A and 1B are diagrams illustrating the configuration of a laminated substrate in an embodiment.

In general, according to one embodiment, there is provided a semiconductor manufacturing apparatus including a rotatable substrate stage, a first measuring mechanism and a second measuring mechanism. On the rotatable substrate stage, a laminated substrate used for manufacturing a semiconductor device is placed. The laminated substrate is formed by a first substrate and a second substrate to be laminated to each other. The first measuring mechanism measures an edge of the first substrate and an edge of the second substrate in a first direction. The second measuring mechanism measures the edge of the first substrate and the edge of the second substrate in a second direction. The second direction is a direction different in the first direction in an angle to a normal of the first substrate.

Exemplary embodiments of a semiconductor manufacturing apparatus will be explained below in detail with reference to the accompanying drawings. The present invention is not limited to the following embodiments.

Embodiment

The semiconductor manufacturing apparatus according to the embodiment is an apparatus used for manufacturing a semiconductor device, and can be used, for example, for alignment when processing a laminated substrate in which a plurality of substrates is laminated.

For example, one of the semiconductor device manufacturing techniques includes a technique for singulating a laminated substrate in which a plurality of substrates is laminated into a plurality of laminated devices by a dicing process. In this technique, each substrate is in the form of a thin disk on which a number of semiconductor chips are formed. Laminating a plurality of substrates to each other then forms a laminated substrate. The laminated substrate is singulated into a plurality of laminated devices by a dicing process. Each of the laminated devices is a device to be a final product, and has a configuration in which a plurality of semiconductor chips is laminated. The use of this technique allows each of the substrates to be independently formed in parallel, so that the technique has an advantage that the manufacturing period can be shortened as compared with the case of forming a device on a single substrate, for example.

The manufacturing flow of the laminated device has a process of forming a semiconductor device structure after the substrates are laminated to form a laminated substrate. Specifically, the flow includes an inspection process of measuring the overlapping state of the patterns of the upper and lower substrates constituting the laminated substrate, a process of trimming the outer periphery of the substrate, and a lithography process of performing patterning necessary for further fabricating a semiconductor structure after the lamination. The process of trimming the outer periphery of the substrate is a process of trimming the outer periphery by placing a trimming blade on the outer periphery of the substrate and rotating the substrate along the rotation center of the substrate. The apparatus used in these processes may use the center position of each substrate of the laminated substrate and/or the center position of the laminated substrate in operations such as positioning or alignment of the substrate to be processed and/or regions within the substrate. Therefore, determining the center position of each substrate of the laminated substrate and/or the center position of the laminated substrate with a predetermined accuracy is desirable.

In a semiconductor manufacturing apparatus, when processing of a laminated substrate is not assumed, the positioning may be based on the assumption that the substrate is substantially an ideal circular shape. As an example of a typical flow, a pre-alignment process for calculating a rough position of a pattern on a substrate by detecting a plurality of notched positions (so-called "notch") of the substrate and an outer peripheral position of a circular substrate is performed, and then an alignment process for detecting the position of the pattern on the substrate is performed to perform an alignment process for highly accurately positioning the pattern with a more accurate optical system.

Figure 1B:
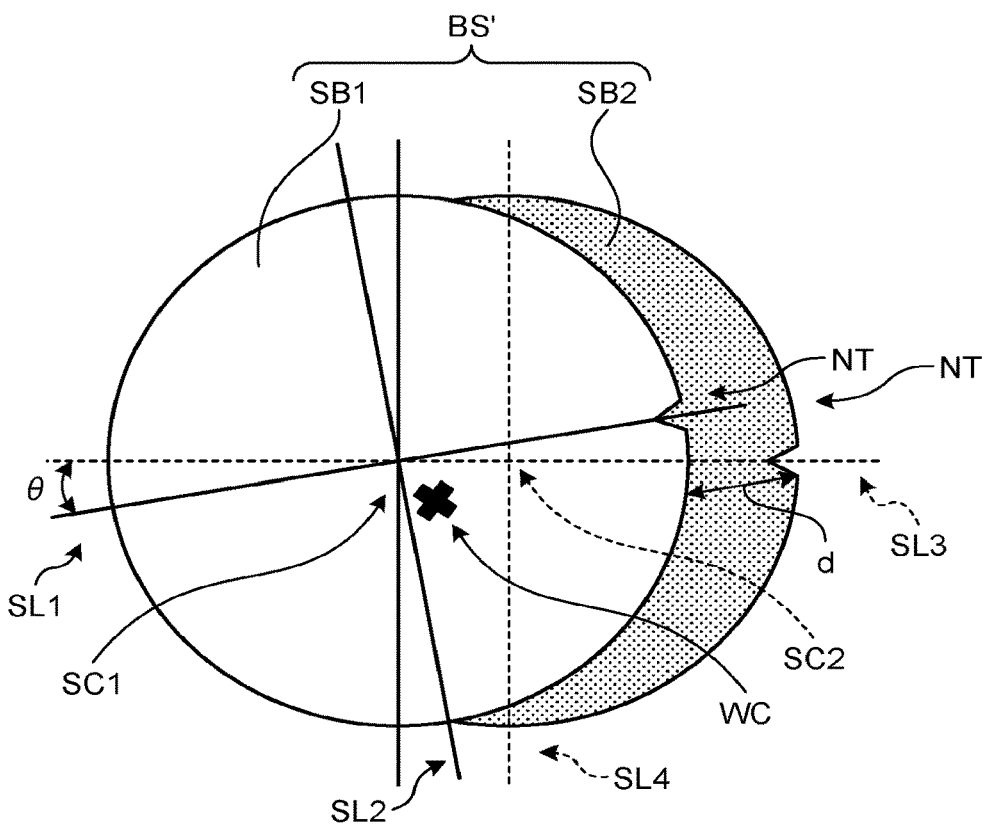

On the other hand, as illustrated in FIGS. 1A and 1B, a laminated substrate BS usually has a shape (hereinafter referred to as a misaligned substrate shape) which is not an ideal circular shape, because there are a tolerance of upper and lower substrate sizes and a finite error in alignment of patterns patterned on the upper and lower substrates so that, when viewed from right above, the upper and lower substrates are misaligned with each other. FIGS. 1A and 1B are diagrams illustrating the configuration of the laminated substrate BS. Hereinafter, in a state in which the laminated substrate BS is placed on the substrate stage, the substrate of the laminated substrate BS remote from the substrate stage is referred to as an upper substrate SB1, and the substrate adjacent to the substrate stage is referred to as a lower substrate SB2 for convenience.

In FIGS. 1A and 1B, a center line SL1 passing through the notch NT of the upper substrate SB1 and a center line SL2 perpendicular to the center line SL1 are indicated by solid lines, respectively, and a center position SC1 of the upper substrate SB1 is indicated as an intersection point between the center line SL1 and the center line SL2. A center line SL3 passing through the notch NT of the lower substrate SB2 and a center line SL4 perpendicular to the center line SL3 are indicated by dotted lines, respectively, and a center position SC2 of the lower substrate SB2 is indicated as an intersection point between the center line SL3 and the center line SL4. The position of the rotation center WC of the substrate stage is indicated by x.

In the case where the directions of the upper and lower substrates SB1 and SB2 align with each other in the laminated substrate BS, the center lines SL1 and SL3 align with each other as illustrated in FIG. 1A, and the line connecting the center positions SC1 and SC2 of the substrates SB1 and SB2 substantially aligns with the center lines SL1 and SL3. On the other hand, in the case where the directions of the upper and lower substrates SB1 and SB2 are misaligned in the laminated substrate BS', the center lines SL1 and SL3 form an angle θ with respect to each other as illustrated in FIG. 1B, and the line connecting the center positions SC1 and SC2 of the substrates SB1 and SB2 forms an angle θ with respect to the center line SL3, for example. Although the following discussion proceeds based on the arrangement in FIG. 1A, when the directions of the upper and lower substrates SB1 and SB2 are misaligned, e can be added to each angle of one of the upper and lower substrates SB1 and SB2 to correspond to the arrangement in FIG. 1B, and thus generality is not lost.

Figure 2:
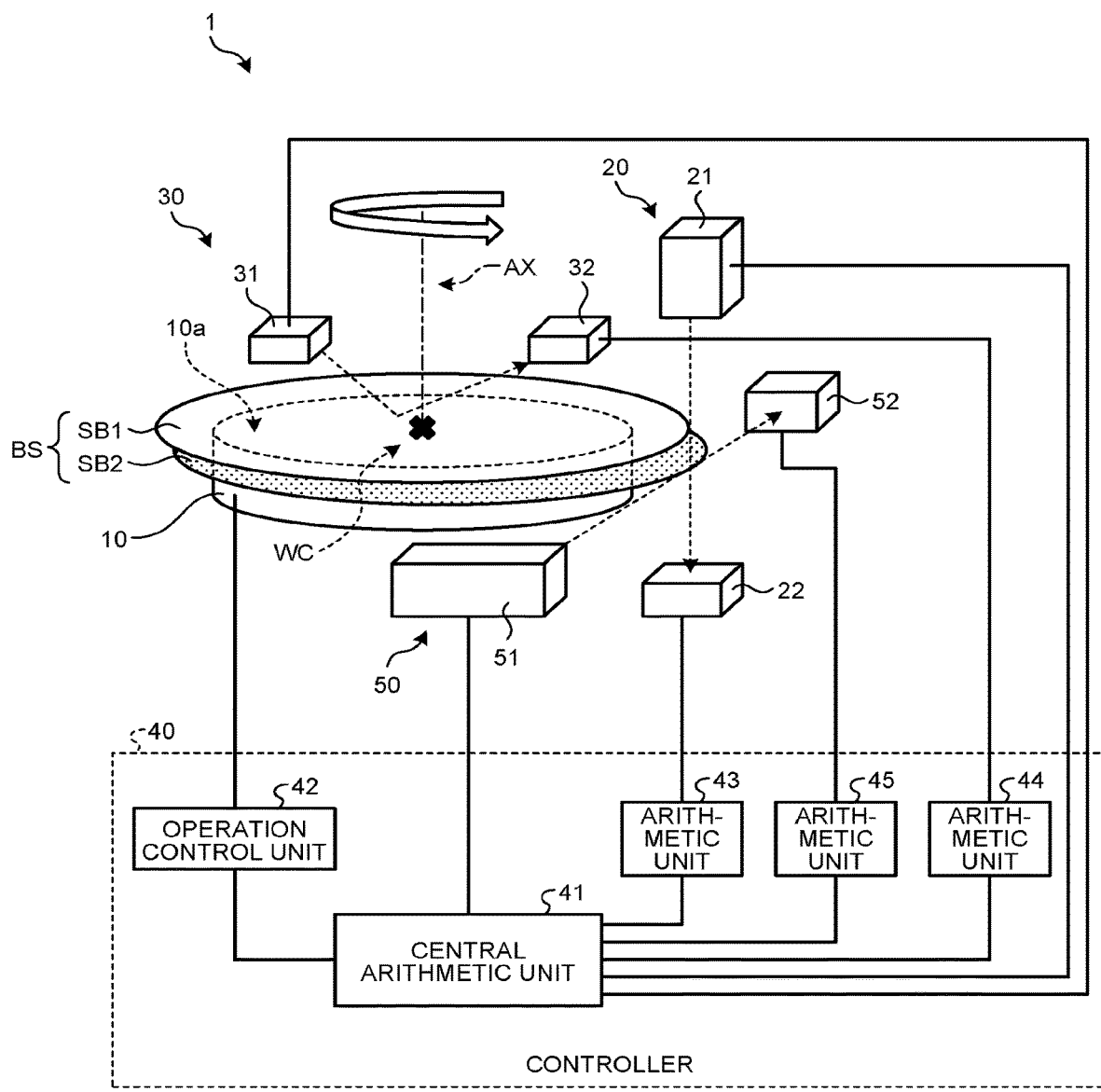
FIG. 2 is a diagram illustrating a configuration of a semiconductor manufacturing apparatus according to the embodiment.

The laminated substrate BS illustrated in FIG. 1A is moved by a substrate transfer system and placed on the substrate stage of the semiconductor manufacturing apparatus 1 (see FIG. 2). The semiconductor manufacturing apparatus 1 roughly determines the position/direction of a substrate on the substrate stage by the apparatus itself, and performs a pre-alignment process for correcting a coordinate system in the apparatus so as to position the substrate at a predetermined position. The semiconductor manufacturing apparatus 1 uses the result of the pre-alignment process to perform an alignment process for positioning the substrate with higher accuracy.

For example, the semiconductor manufacturing apparatus 1 can be configured as illustrated in FIG. 2. FIG. 2 is a diagram illustrating a configuration of the semiconductor manufacturing apparatus 1. The semiconductor manufacturing apparatus 1 includes a substrate stage 10, a measuring mechanism 20, a measuring mechanism 30, and a controller 40. Hereinafter, the direction perpendicular to a placement face 10a of the substrate stage 10 is referred to as a Z direction, and the two directions perpendicular to each other in a plane perpendicular to the Z direction are referred to as an X direction and a Y direction. In FIG. 2 and other subsequent drawings, for the sake of simplicity, the illustration of the notch NT of each substrate is omitted.

The controller 40 comprehensively controls each unit of the semiconductor manufacturing apparatus 1. The controller 40 includes a central arithmetic unit 41, an operation control unit 42, an arithmetic unit 43, and an arithmetic unit 44. The central arithmetic unit 41 comprehensively controls each unit of the controller 40.

In the substrate stage 10, the laminated substrate BS is placed on the placement face 10a. The substrate stage 10 may have a predetermined suction mechanism, such as an electrostatic chuck or a vacuum chuck, and may suction and hold the laminated substrate BS via the suction mechanism. The diameter of the substrate stage 10 may be smaller than the diameters of the substrates SB1 and SB2. Thus, the light from the irradiation unit 21 to the light receiving unit 22 can be prevented from interfering with the substrate stage 10. The substrate stage 10 is configured to be rotatable about an axis extending in the Z direction through the rotation center WC as a rotation axis AX.

The measuring mechanism 20 measures the positions of the substrates SB1 and SB2 of the laminated substrate BS in the pre-alignment process. The measuring mechanism 20 measures the edges of the substrates SB1 and SB2 from above the laminated substrate BS (+Z direction). The measuring mechanism 20 includes the irradiation unit 21 arranged on the +Z side with respect to the position where the edge of the substrate is to be arranged, and the light receiving unit 22 arranged on the −Z side with respect to the position where the edge of the substrate is to be arranged.

The central arithmetic unit 41 of the controller controls the irradiation unit 21 so that the measurement light is emitted from the irradiation unit 21. The light receiving unit 22 may have a plurality of pixels arranged in a two-dimensional manner. Upon receiving the measurement light, the light receiving unit 22 supplies a plurality of pixel signals to the arithmetic unit 43 of the controller 40. The arithmetic unit 43 generates the received light intensity distribution data indicating the two-dimensional distribution of the received light intensity of the measurement light according to the received plurality of pixel signals, and supplies the generated light intensity distribution data to the central arithmetic unit 41. The central arithmetic unit 41 can obtain the edge position of the laminated substrate BS according to the received light intensity distribution data.

The measuring mechanism 30 measures a reference position on the laminated substrate BS in order to determine the arrangement position of the device pattern in the alignment process. The measuring mechanism 30 may measure a reference mark on the laminated substrate BS as a reference position. The measuring mechanism 30 measures a reference position on the laminated substrate BS from obliquely above (−X and +Z directions) the laminated substrate BS. The measuring mechanism 30 includes an irradiation unit 31 arranged on the −X and +Z sides with respect to a predetermined reference position, and a light receiving unit 32 arranged on the +X and +Z sides with respect to the predetermined reference position.

The central arithmetic unit 41 of the controller controls the irradiation unit 31 so that the measurement light is emitted from the irradiation unit 31. The light receiving unit 32 may have a plurality of pixels arranged in a two-dimensional manner. Upon receiving the measurement light, the light receiving unit 32 supplies a plurality of pixel signals to the arithmetic unit 44 of the controller 40. The arithmetic unit 44 generates the received light intensity distribution data indicating the two-dimensional distribution of the received light intensity of the measurement light according to the received plurality of pixel signals, and supplies the generated light intensity distribution data to the central arithmetic unit 41. The central arithmetic unit 41 can obtain a reference position (for example, the position of the reference mark) on the laminated substrate BS according to the received light intensity distribution data.

In accordance with the control from the central arithmetic unit 41, the operation control unit 42 of the controller 40 rotates the substrate stage 10 about the rotation center WC (about the rotation axis AX) while the substrate stage 10 holds the laminated substrate BS. Thus, the direction of the laminated substrate BS can be changed.

Figure 3A:
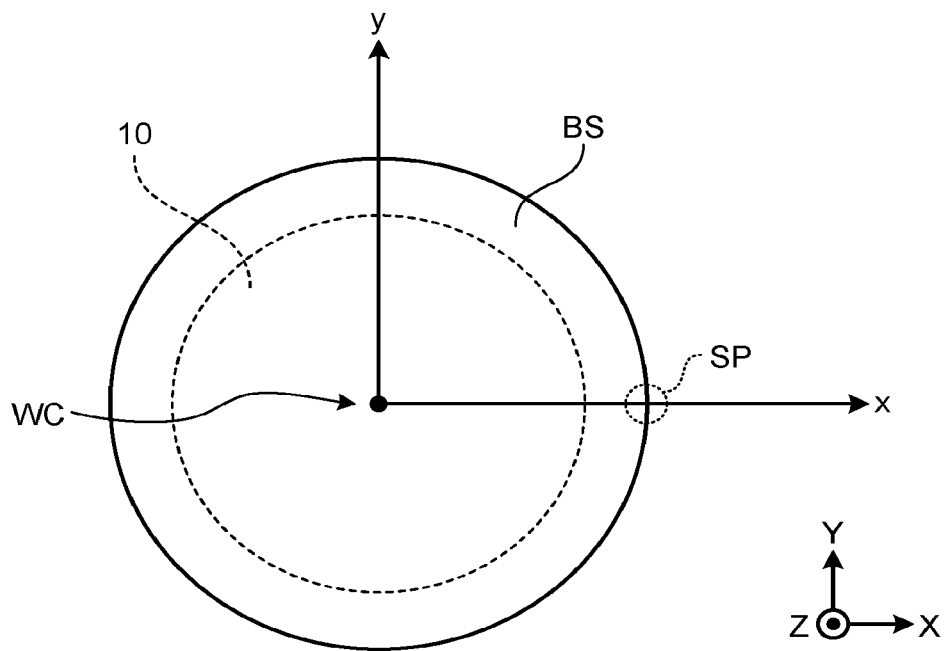
FIGS. 3A and 3B are diagrams illustrating the direction of a substrate stage and the laminated substrate of the semiconductor manufacturing apparatus according to the embodiment.
Figure 3B:
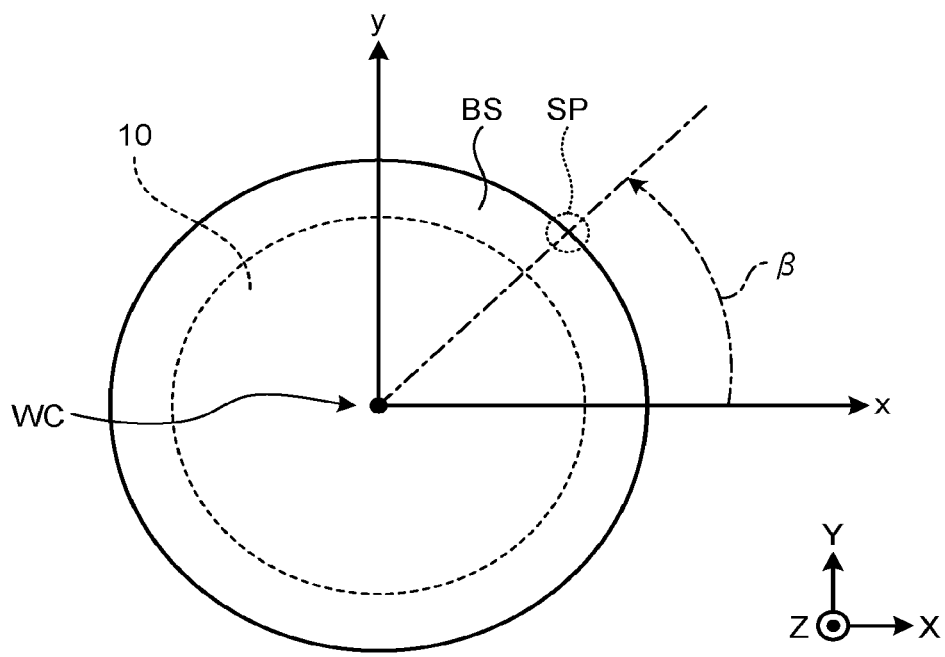

For example, as illustrated in FIGS. 3A and 3B, the xy-axis is defined as an orthonormal system centered on the rotation center WC of the substrate stage 10. FIGS. 3A and 3B are diagrams illustrating the direction of the substrate stage 10 and the substrate BS. The x-axis is an axis extending in the X direction with respect to the rotation center WC of the substrate stage 10. The y-axis is an axis extending in the Y direction with respect to the rotation center WC of the substrate stage 10. The xy-axis maintains a fixed positional relationship with respect to the XYZ-axis even when the substrate stage 10 rotates.

As illustrated in FIG. 3A, since the positions of the notches NT of the substrates SB1 and SB2 of the laminated substrate BS are unknown at the time of starting the pre-alignment process, the position intersecting the x-axis in the outer periphery of the laminated substrate BS placed on the substrate stage 10 is set as the reference edge position SP. In this state, the rotation angle of the substrate stage 10 is 0°, and the direction of the laminated substrate BS is referred to as 0°. From this state, when the substrate stage 10 rotates counterclockwise at a rotation angle β with respect to the rotation center WC, as illustrated in FIG. 3B, the reference edge portion SP forms an angle β with the x-axis with respect to the rotation center WC. The direction of the laminated substrate BS in this state is referred to as direction β.

In the measuring mechanism 20 illustrated in FIG. 2, the irradiation unit 21 may be arranged on the +Z side and the light receiving unit 22 may be arranged on the −Z side, at or near the intersection position of the edge of the laminated substrate BS and the x-axis. In the measuring mechanism 20, the light emitted from the irradiation unit 21 advances in the −Z direction, and while at least a part of the light is shielded by the edge of the laminated substrate BS, further advances in the −Z direction and is received by the light receiving unit 22. The measuring mechanism 20 is capable of detecting the x position of the edge of the laminated substrate BS according to the distribution of the intensity of the light received by the light receiving unit 22 which is advanced from the irradiation unit 21 in the −Z direction.

When the semiconductor manufacturing apparatus 1 rotates the substrates SB1 and SB2 about the rotation center WC on the substrate stage 10, the X position of the edge changes, and the intensity distribution of the light received by the light receiving unit 22 also changes. Accordingly, the semiconductor manufacturing apparatus 1 may be capable of obtaining the X position of the edge of the substrates SB1 and SB2.

The case where the upper and lower substrates SB1 and SB2 constituting the laminated substrate BS are superposed exactly, or the case where one of the upper and lower substrates SB1 and SB2 is sufficiently larger than the other and looks like a perfect circle (outer shape of a single substrate) when viewed from the Z direction, is then considered. In this case, in the semiconductor manufacturing apparatus 1, the measuring mechanism 20 detects the x position of the substrate edge with respect to at least three directions, whereby the rotation center WC of the substrate stage 10 is aligned with the center of the aforementioned perfect circle, and detecting the notch NT allows the direction of the notch NT to be aligned with a predetermined direction, thereby completing the pre-alignment.

However, the overlapping of the upper and lower substrates SB1 and SB2 is actually accompanied by a finite error d as illustrated in FIG. 1A, and the outer shape of the upper and lower substrates SB1 and SB2 has a misaligned substrate shape which is not a perfect circle when viewed from the Z direction. Therefore, the method of detecting the edge position with respect to at least three directions described above hardly determine the rotation center of the substrate uniquely with respect to the outer shape of the substrate (misaligned substrate shape), and the pre-alignment may not be completed. Alternatively, even if the pre-alignment is completed, a non-ideal position with poor reproducibility is recognized as the center of the substrate, and the reference position for the device pattern arrangement on the substrate may not be accurately measured in the alignment process for performing the next high-precision positioning.

In other words, in the process of processing the laminated substrate BS, when the pre-alignment is performed by unidirectional measurement by the measuring mechanism 20, the positions of the substrates SB1 and SB2 of the laminated substrate BS may not be accurately determined. Thus, the manufacturing yield of the laminated substrate and the laminated device may be reduced, or contamination of the semiconductor manufacturing facility, which will be described below, may occur when the process after the pre-alignment is not performed appropriately.

Therefore, in the present embodiment, the semiconductor manufacturing apparatus 1 improves the accuracy of position measurements of the substrates SB1 and SB2 of the laminated substrate BS by additionally including a measuring mechanism 50 for detecting the edges the substrates SB1 and SB2 in a direction different from that of the measuring mechanism 20.

Specifically, as illustrated in FIG. 2, the semiconductor manufacturing apparatus 1 further includes a measuring mechanism 50. The measuring mechanism 50 measures the positions of the substrates SB1 and SB2 on the laminated substrate BS in the pre-alignment process. The measuring mechanism 50 detects the edges of the substrates SB1 and SB2 from the side (−Y direction) of the laminated substrate BS. The measuring mechanism 50 includes an irradiation unit 51 arranged on the −Y side with respect to a position where the edge of the substrate is to be arranged, and a light receiving unit 52 arranged on the +Y side with respect to a position where the edge of the substrate is to be arranged.

The controller 40 further includes an arithmetic unit 45. The central arithmetic unit 41 controls the irradiation unit 51 so that measurement light is emitted from the measuring mechanism 50. The light receiving unit 52 may have a plurality of pixels arranged in a two-dimensional manner. Upon receiving the measurement light, the light receiving unit 52 supplies a plurality of pixel signals to the arithmetic unit 45 of the controller 40. The arithmetic unit 45 generates the received light intensity distribution data indicating the two-dimensional distribution of the received light intensity of the measurement light according to the received plurality of pixel signals, and supplies the generated light intensity distribution data to the central arithmetic unit 41. The central arithmetic unit 41 can obtain the x position of the edge of the laminated substrate BS according to the received light intensity distribution data.

In the semiconductor manufacturing apparatus 1, the measuring mechanism 20 and the measuring mechanism 50 measure the edge positions of the substrates SB1 and SB2 from different angles to the normal (Z direction) of the surface of the laminated substrate BS with respect to the misaligned substrate shape of the laminated substrate BS. In other words, the measuring mechanism 20 detects the edge position of the substrate by the measurement light along the Z direction, and the measuring mechanism 50 detects the edge position of the substrate by the measurement light along the Y direction. Thus, since three-dimensional information with respect to the edge position of the substrate can be obtained, the semiconductor manufacturing apparatus 1 can calculate the center positions of the upper and lower substrates SB1 and SB2 with reference to the rotation center WC of the substrate stage 10.

Figure 8A:
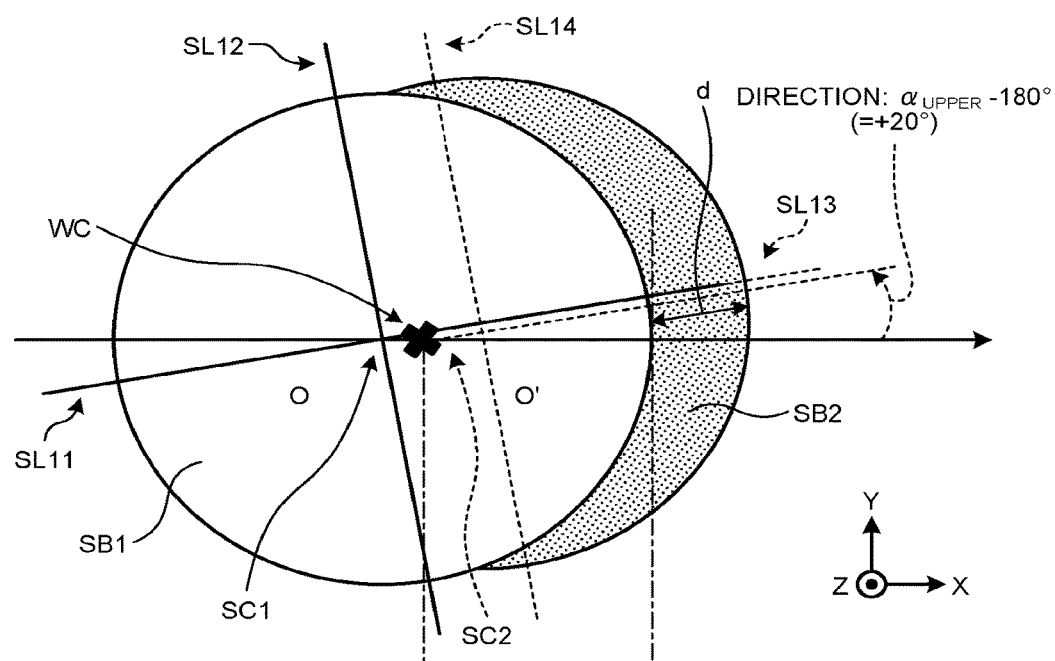
FIGS. 8A and 8B are diagrams illustrating the measurement results of the edge position of the upper substrate in the embodiment.
Figure 8B:
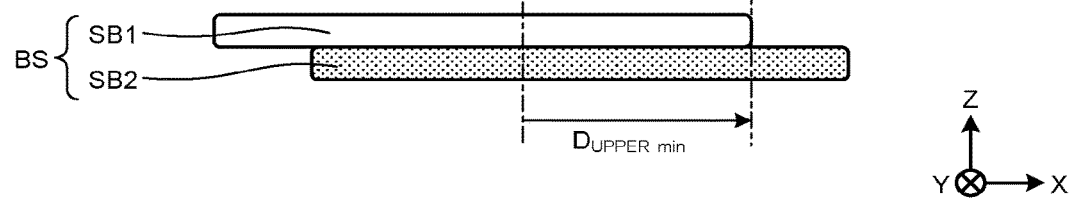
Figure 9A:
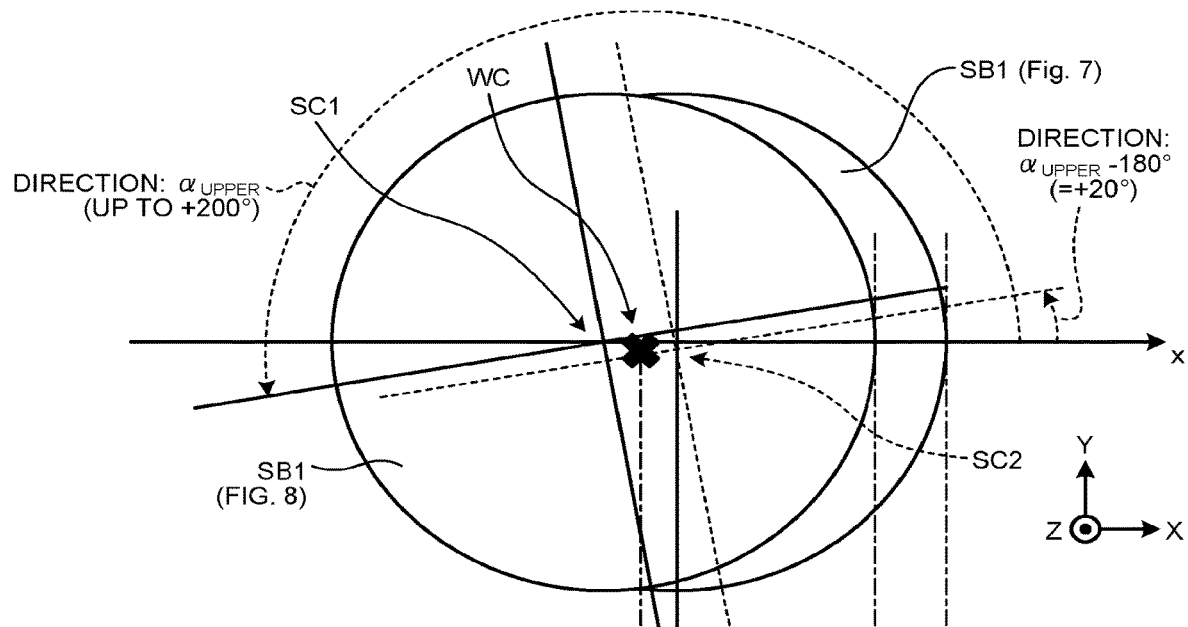
FIGS. 9A to 9C are diagrams illustrating the center position of the upper substrate in the embodiment.
Figure 9B:
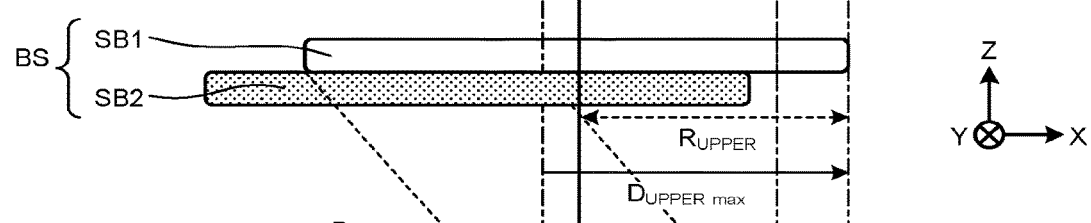
Figure 9C:
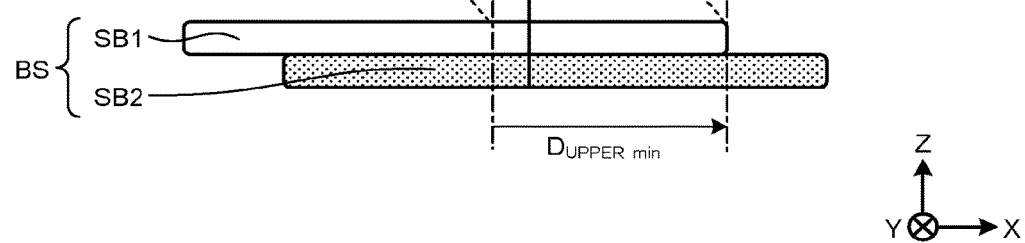
Figure 10:
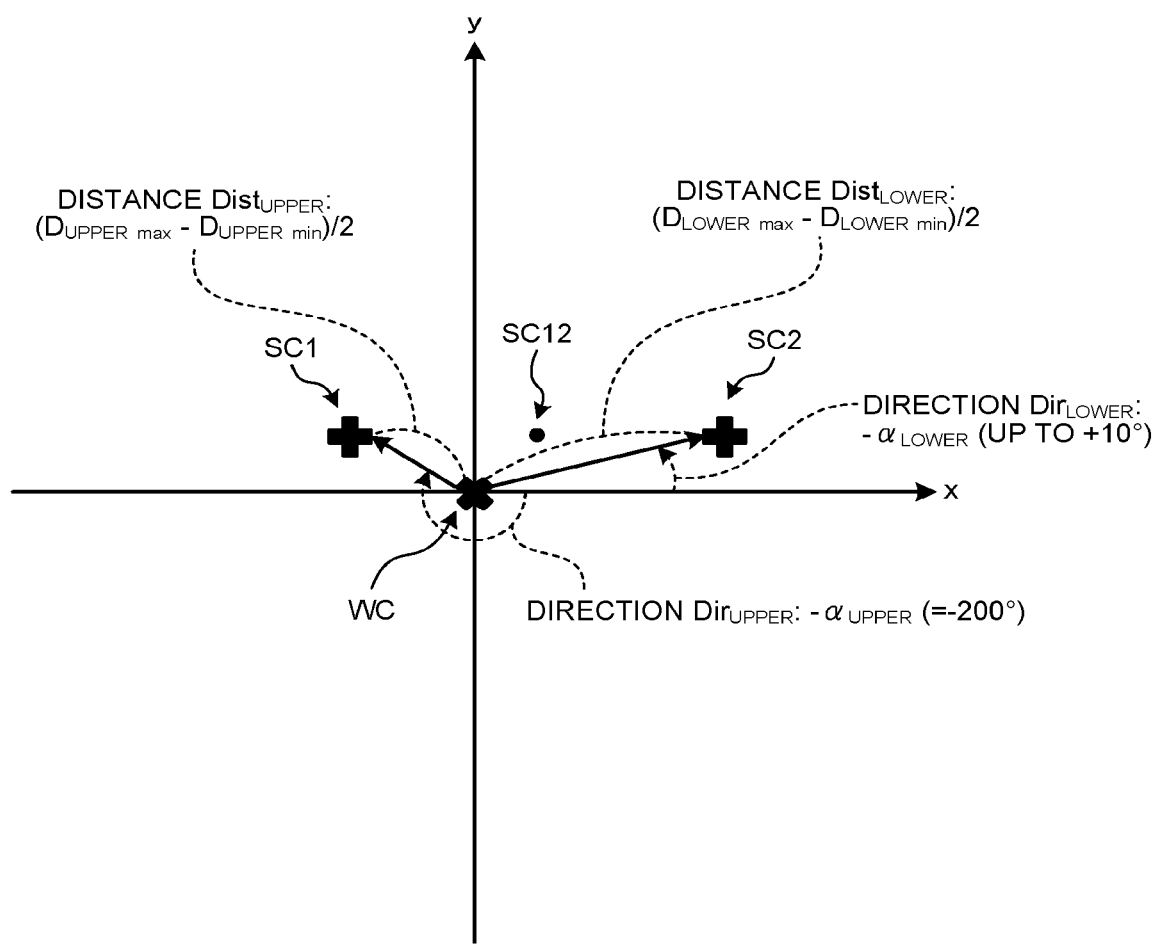
FIG. 10 is a diagram illustrating the rotational center position, the center position of the lower substrate, and the center position of the upper substrate in the embodiment.

Specifically, as illustrated in FIGS. 4A to 10, the semiconductor manufacturing apparatus 1 measures the positions of the upper and lower substrates SB1 and SB2 and calculates their center positions. FIGS. 4A, 4B, 5A and 5B are diagrams illustrating the measurement results of the edge position of the lower substrate. FIGS. 6A to 6C are diagrams illustrating the center position of the lower substrate. FIGS. 7A, 7B, 8A and 8B are diagrams illustrating the measurement results of the edge position of the upper substrate. FIGS. 9A to 9C are diagrams illustrating the center position of the upper substrate. FIG. 10 is a diagram illustrating the rotational center position, the center position of the lower substrate, and the center position of the upper substrate.

At the time of starting the pre-alignment process, although the center line and the center position of the substrates SB1 and SB2, and the reference edge position SP (see FIG. 3A) for determining the center line are unknown, FIGS. 4A to 9C illustrate the center lines SL11, SL12, SL13, and SL14 of the substrates SB1 and SB2 for convenience. The center line SL11 passing through the reference edge position SP of the upper substrate SB1 and the center line SL12 perpendicular to the center line SL11 are indicated by solid lines, respectively, and the center position SC1 of the upper substrate SB1 is indicated as an intersection point between the center line SL11 and the center line SL12. The center line SL13 passing through the reference edge position SP of the lower substrate SB2 and the center line SL14 perpendicular to the center line SL13 are indicated by dotted lines, respectively, and the center position SC2 of the lower substrate SB2 is indicated as an intersection point between the center line SL13 and the center line SL14. The position of the rotation center WC of the substrate stage 10 is indicated by x.

FIGS. 4A, 5A, 6A, 7A, 8A, and 9A are XY plan views of the laminated substrate BS, and correspond to the measurement results of the measuring mechanism 20. FIGS. 4B, 5B, 6B, 7B, 8B, and 9B are XZ sectional views of the laminated substrate BS, and correspond to the measurement results of the measuring mechanism 50.

FIGS. 4A to 6C illustrate a procedure for determining a center SC2 of the lower substrate SB2 with respect to the rotation center WC when the rotation center WC of the substrate stage 10 is in a state as illustrated in FIG. 1A with respect to the laminated substrate BS. In FIGS. 4A to 6C, a plurality of parameters $\alpha_{lower}$, $D_{lower\ max}$, $D_{lower\ min}$, and $D_{ist\ lower}$ are measured, and these parameters are used to determine the center SC2 of the lower substrate SB2.

FIGS. 7A to 9C illustrate a procedure for determining the center SC1 of the upper substrate SB1 with respect to the rotation center WC when the rotation center WC of the substrate stage 10 is in a state as illustrated in FIG. 1A with respect to the laminated substrate BS. In FIGS. 7A to 9C, a plurality of parameters $\alpha_{upper}$, $D_{upper\ max}$, $D_{upper\ min}$, and $D_{ist\ upper}$ are measured, and these parameters are used to determine the center SC1 of the upper substrate SB1.

Figure 4A:
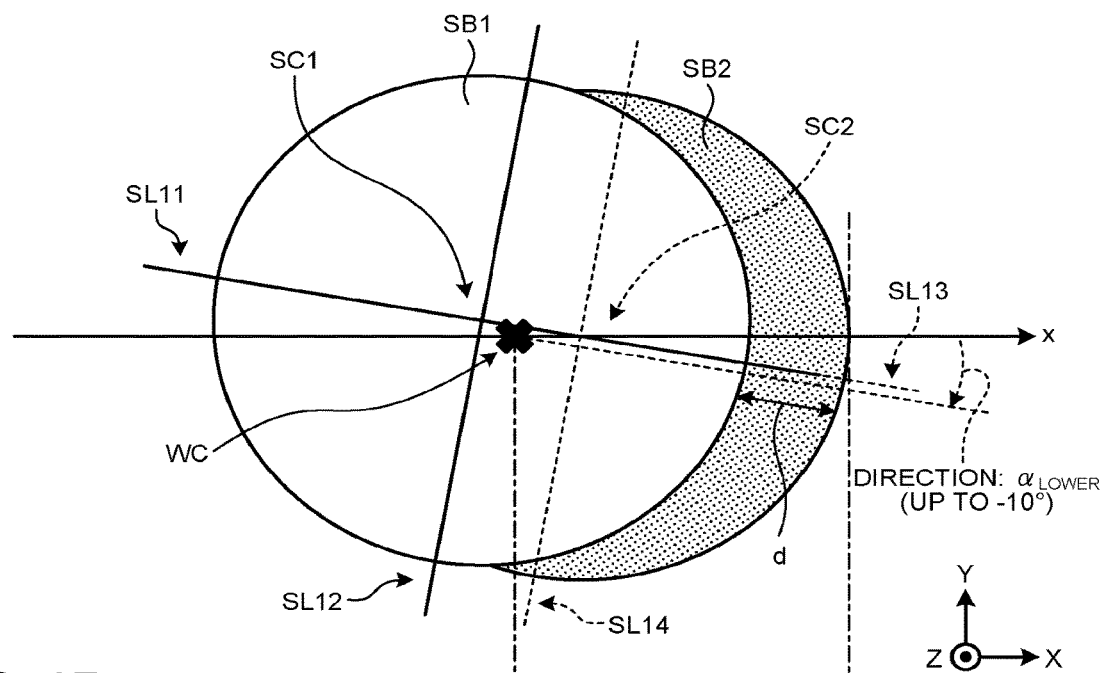
FIGS. 4A and 4B are diagrams illustrating the measurement results of the edge position of a lower substrate in the embodiment.
Figure 4B:
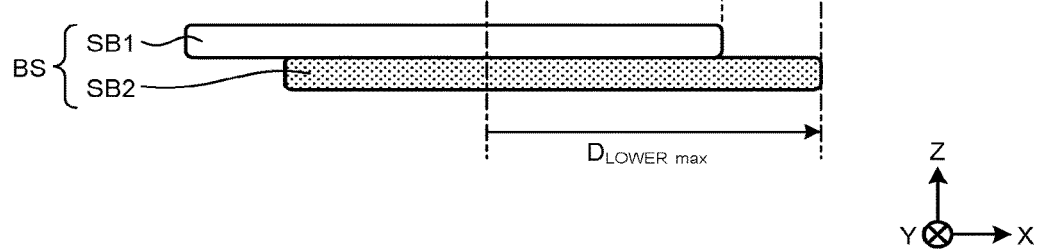

FIGS. 4A and 4B illustrate that when the laminated substrate BS is rotated about the rotation center WC and the measuring mechanism 20 and the measuring mechanism 50 are used, as the state when the lower substrate SB2 protrudes most toward the +x side, the direction $\alpha_{lower}$ and the distance $D_{lower\ max}$ from the rotation center WC of the edge on the +x side are measured. In this case, the center SC2 of the lower substrate SB2 is positioned on the x-axis together with the rotation center WC. In FIG. 4, an angle of about −10° is illustrated as an angle of the direction glower.

Figure 5A:
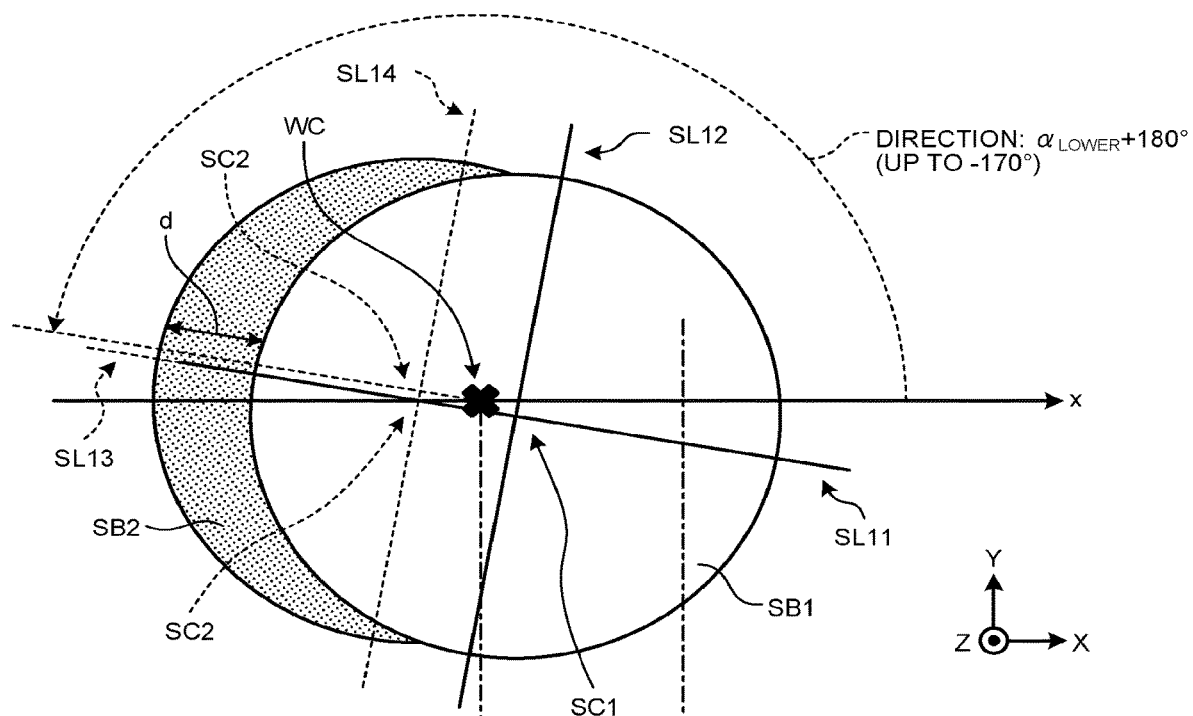
FIGS. 5A and 5B are diagrams illustrating the measurement results of the edge position of the lower substrate in the embodiment.
Figure 5B:
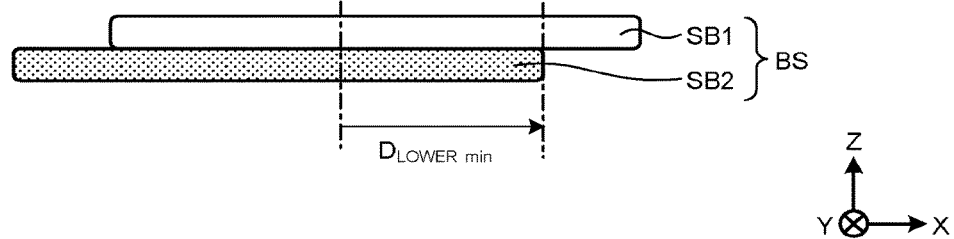

FIGS. 5A and 5B illustrate that when the laminated substrate BS is rotated about the rotation center WC and the measuring mechanism 20 and the measuring mechanism 50 are used, as the state when the lower substrate SB2 protrudes most toward the −x side, the direction $\alpha_{lower}$+180° and the distance $D_{lower\ min}$ from the rotation center WC of the edge on the +x side are measured. In this case, the center SC2 of the lower substrate SB2 is positioned on the x-axis together with the rotation center WC. In FIGS. 5A and 5B, an angle of about 170° is illustrated as an angle of the direction $\alpha_{lower}$+180°.

Figure 6A:
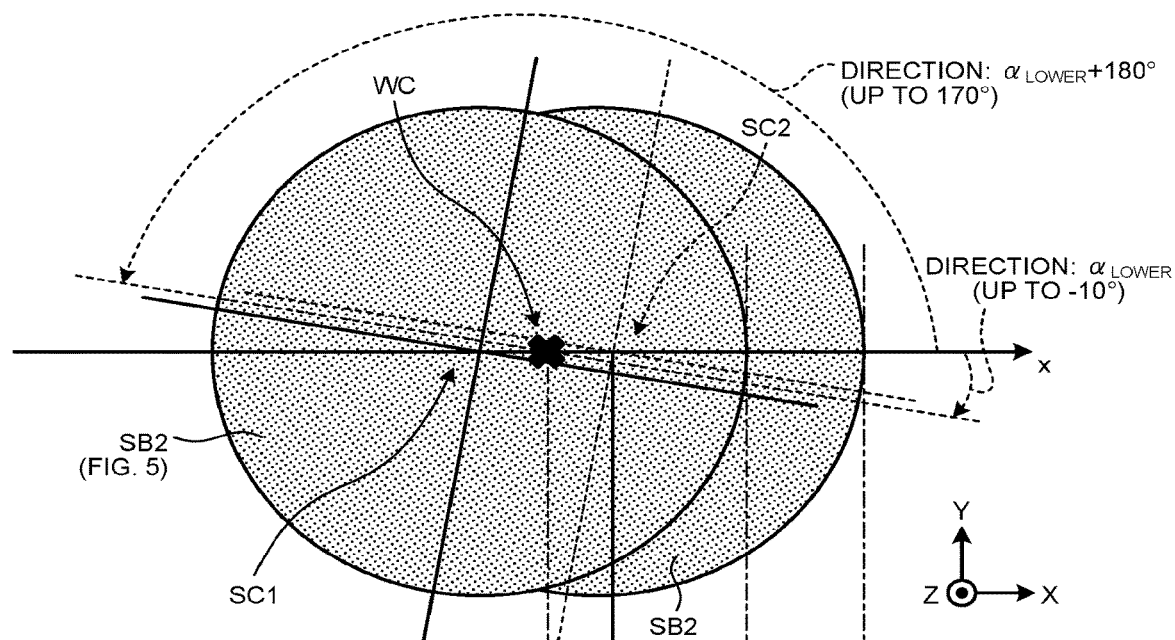
FIGS. 6A to 6C are diagrams illustrating the center position of the lower substrate in the embodiment.
Figure 6B:
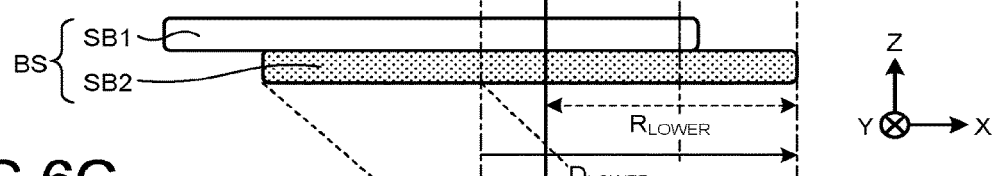
Figure 6C:
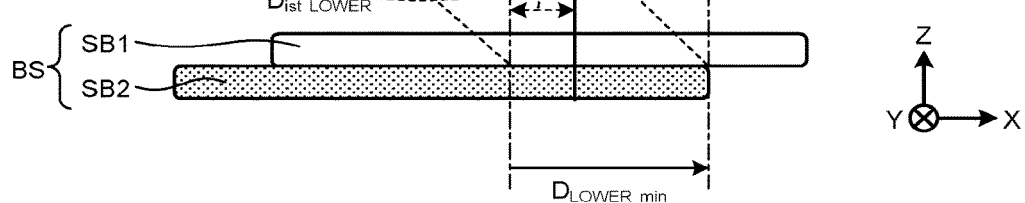

FIG. 6A is a diagram in which the lower substrate SB2 in FIG. 4A and the lower substrate SB2 in FIG. 5A are overlapped, and FIGS. 6B and 6C are diagrams in which FIGS. 4B and 5B are illustrated together. From the geometrical consideration, the distance $D_{ist\ lower}$ between the rotation center WC and the center SC2 of the lower substrate SC2 is obtained as illustrated in the following Formula 1 with respect to FIGS. 6A to 6C.

$$D_{ist\ lower}(D_{lower\ max} - D_{lower\ min})/2 \qquad \text{Formula 1}$$

The radius $R_{lower}$ of the lower substrate SB2 is also obtained by the following Formula 2.

$$R_{lower}(D_{lower\ max} + D_{lower\ min})/2 \qquad \text{Formula 2}$$

Figure 7A:
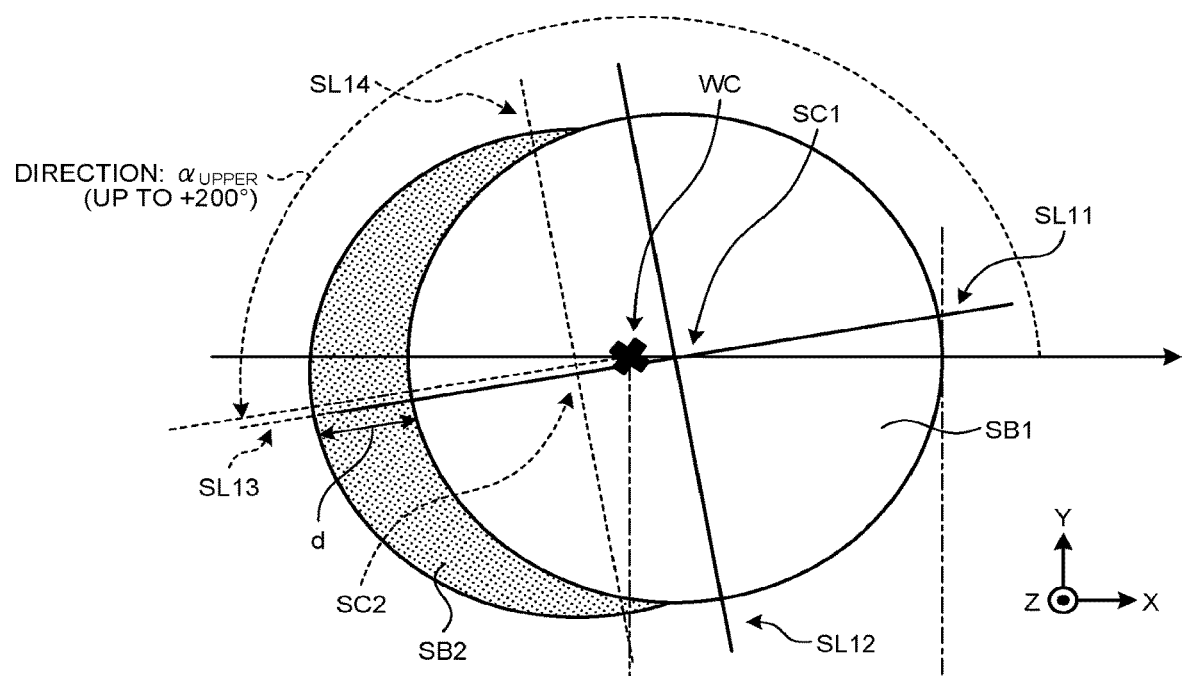
FIGS. 7A and 7B are diagrams illustrating the measurement results of the edge position of an upper substrate in the embodiment.
Figure 7B:
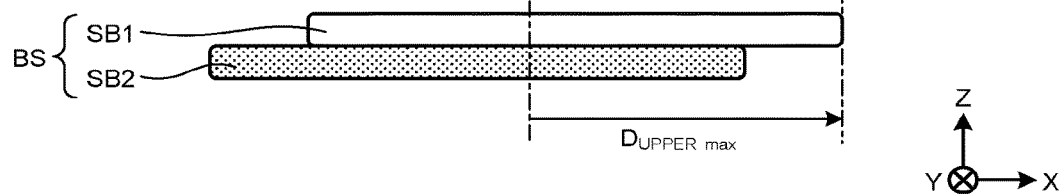

FIGS. 7A and 7B illustrate that when the laminated substrate BS is rotated about the rotation center WC and the measuring mechanism 20 and the measuring mechanism 50 are used, as the state when the upper substrate SB1 protrudes most toward the +x side, the direction $\alpha_{upper}$ and the distance $D_{upper\ max}$ from the rotation center WC of the edge on the +x side are measured. In this case, the center SC1 of the upper substrate SB1 is positioned on the x-axis together with the rotation center WC. In FIGS. 7A and 7B, an angle of about +200° is illustrated as an angle of the direction $\alpha_{upper}$.

FIGS. 8A and 8B illustrate that when the laminated substrate BS is rotated about the rotation center WC and the measuring mechanism 20 and the measuring mechanism 50 are used, as the state when the upper substrate SB1 protrudes most toward the −x side, the direction $\alpha_{upper}$−180° and the distance $D_{upper\ min}$ from the rotation center WC of the edge on the +x side are measured. In this case, the center SC1 of the upper substrate SB1 is positioned on the x-axis together with the rotation center WC. In FIGS. 8A and 8B, an angle of about +20° is illustrated as an angle of the direction $\alpha_{upper}$−180°.

FIG. 9A is a diagram in which the upper substrate SB1 in FIG. 7A and the upper substrate SB1 in FIG. 8A are overlapped, and FIGS. 9B and 9C are diagrams in which FIGS. 7B and 8B are illustrated together. From the geometrical consideration, the distance $D_{ist\ upper}$ between the rotation center WC and the center SC1 of the upper substrate SC1 is obtained as illustrated in the following Formula 3 with respect to FIGS. 9A to 9C.

$$D_{ist\ upper}=(D_{upper\ max}-D_{upper\ min})/2 \quad \text{Formula 3}$$

The radius $R_{upper}$ of the upper substrate SB1 is also obtained by the following Formula 4.

$$R_{upper}=(D_{upper\ max}+D_{upper\ min})/2 \quad \text{Formula 4}$$

FIG. 10 illustrates the positional relationship between the rotation center WC of the substrate stage 10, the center SC2 of the lower substrate SB2, and the center SC1 of the upper substrate SB1. In FIG. 10, the positional relationship of the center SC2 of the lower substrate SB2 with respect to the rotation center WC is expressed by the direction $Dir_{lower}$ of the center SC2 of the lower substrate SB2 as viewed from the rotation center WC and the distance $D_{ist\ lower}$ from the rotation center WC to the center SC2. In other words, the position of the center SC2 of the lower substrate SB2 is determined, with reference to the rotation center WC, by obtaining the direction $Dir_{lower}$ as illustrated in Formula 5 and the distance $D_{ist\ lower}$ as illustrated in Formula 1.

$$Dir_{upper}=-\alpha_{upper} \quad \text{Formula 5}$$

Further, in FIG. 10, the positional relationship of the center SC1 of the upper substrate SB1 with respect to the rotation center WC is expressed by the direction $Dir_{upper}$ of the center SC1 of the lower substrate SB1 as viewed from the rotation center WC and the distance $D_{lower}$ from the rotation center WC to the center SC1. In other words, the position of the center SC1 of the upper substrate SB1 is determined, with reference to the rotation center WC, by obtaining the direction Dir upper as illustrated in Formula 6 and the distance $D_{ist\ upper}$ as illustrated in Formula 3.

$$Dir_{upper}=-\alpha_{upper} \quad \text{Formula 6}$$

Figure 11:
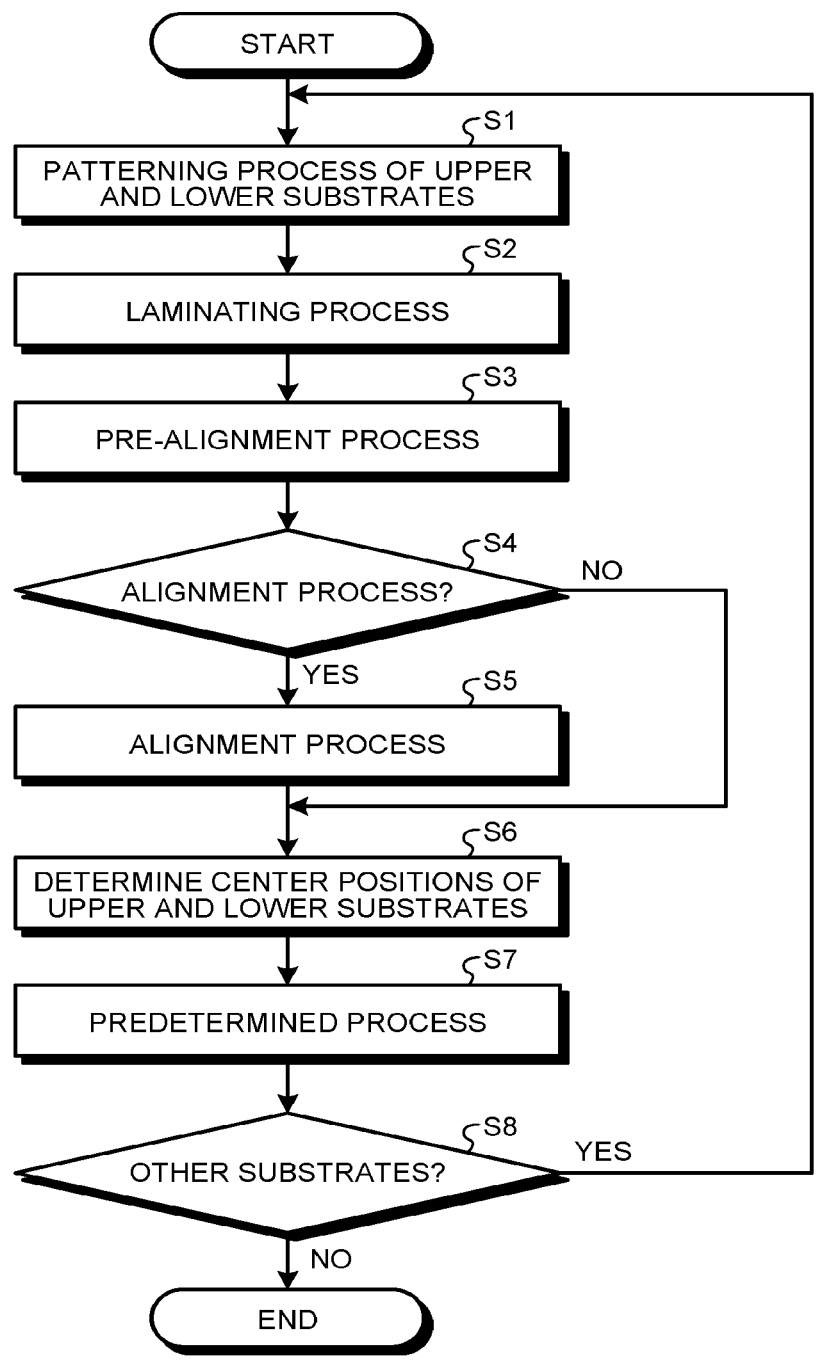
FIG. 11 is a flowchart illustrating a method of manufacturing a semiconductor device in the embodiment.

A method of manufacturing a semiconductor device including a pre-alignment process will now be described with reference to FIG. 11. FIG. 11 is a flowchart illustrating a method of manufacturing a semiconductor device.

The upper substrate SB1 and the lower substrate SB2 are subjected to patterning process respectively (S1). A predetermined device pattern is formed on the upper substrate SB1 and the lower substrate SB2. The substrate conveying system conveys the upper substrate SB1 and the lower substrate SB2 to a substrate lamination device (not illustrated). The substrate lamination device performs a laminating process (S2). The substrate lamination device laminates the upper substrate SB1 and the lower substrate SB2 together to form a laminated substrate BS by, for example, suctioning the upper substrate SB1 on an upper stage, suctioning the lower substrate SB2 on a lower stage and bringing the upper stage and the lower stage close to each other. The substrate conveying system conveys the laminated substrate BS from the substrate lamination device to the semiconductor manufacturing apparatus 1. When the laminated substrate BS is placed on the substrate stage 10, the semiconductor manufacturing apparatus 1 roughly determines the positions/directions of the substrates SB1 and SB2 of the laminated substrate BS by the apparatus itself, and performs a pre-alignment process for correcting the coordinate system in the apparatus so as to position at a predetermined position (S3). The semiconductor manufacturing apparatus 1 determines whether an alignment process for more precise positioning is necessary (S4), and if the process is determined not to be necessary (No in S4), skips the alignment process (S5), and if the process is determined necessary (Yes in S4), performs an alignment process (S5). The semiconductor manufacturing apparatus 1 determines the center positions of the substrates SB1 and SB2 of the laminated substrate BS according to the results of the pre-alignment process and the alignment process (S6), and performs a predetermined process (S7) according to the center positions of the substrates SB1 and SB2. As a predetermined process, a patterning process for forming a predetermined device pattern on a lamination face and an opposite face to the lamination face of the substrates SB1 and SB2 can be performed.

In this case, when the upper substrate SB1 is processed, positioning may be performed with the center SC1 of the upper substrate SB1 (for example, the center SC1 may be aligned with the rotation center WC of the substrate stage 10). When the lower substrate SB2 is processed, positioning may be performed with the center SC2 of the lower substrate SB2 (for example, the center SC2 may be aligned with the rotation center WC of the substrate stage 10).

Alternatively, the center SC1 of the upper substrate SB1 may be redefined as the center of the laminated substrate BS. When the upper substrate SB1 is processed, positioning may be performed with the center SC1 of the laminated substrate BS (for example, the center SC1 may be aligned with the rotation center WC of the substrate stage 10). The center SC2 of the lower substrate SB2 may also be redefined as the center of the laminated substrate BS. When the lower substrate SB2 is processed, positioning may be performed with the center SC2 of the laminated substrate BS (for example, the center SC2 may be aligned with the rotation center WC of the substrate stage 10).

Alternatively, the midpoint SC12 between the center SC1 of the upper substrate SB1 and the center SC2 of the lower substrate SB2 (see FIG. 10) may be redefined as the center of the laminated substrate BS. When the upper substrate SB1 is processed, positioning may be performed with the center SC12 of the laminated substrate BS (for example, the center SC12 may be aligned with the rotation center WC of the substrate stage 10). When the lower substrate SB2 is also processed, positioning may be performed with the center SC12 of the laminated substrate BS (for example, the center SC12 may be aligned with the rotation center WC of the substrate stage 10).

If the process should be performed on other substrates (Yes in S8), the process is returned to S1, and the process after S1 is performed on other substrates. If the process should not be performed on other substrates (No in S8), the process is terminated.

As described above, in the semiconductor manufacturing apparatus 1 of the present embodiment, in addition to the measuring mechanism 20, a measuring mechanism 50 for detecting the edges of the substrates SB1 and SB2 in a direction different from the measuring mechanism 20 is additionally provided. In other words, the measuring mechanism 20 and the measuring mechanism 50 measure the edge positions of the substrates SB1 and SB2 with different measuring angles to the normal (Z direction) of the surface of the laminated substrate BS with respect to the misaligned substrate shape of the laminated substrate BS. In other words, the measuring mechanism 20 detects the edge position of the substrate by the measurement light along the Z direction, and the measuring mechanism 50 detects the edge position of the substrate by the measurement light along the Y direction. Thus, three-dimensional information on the edge position of the substrate can be obtained, so that the position measurement of the substrates SB1 and SB2 of the laminated substrate BS can be made highly accurate. Therefore, the manufacturing yield of the laminated substrate and the laminated device can be improved, and the unit price of the semiconductor device to be manufactured can be easily reduced. Further, the process after the pre-alignment can be appropriately performed, and the occurrence of contamination of the semiconductor manufacturing facility can be suppressed.

Note that, in the pre-alignment process (S3) illustrated in FIG. 11, the measurement of the edge position of the substrate by the measuring mechanism 20 and the measurement of the edge position of the substrate by the measuring mechanism 50 may be performed in parallel or sequentially. When the measurement is performed in parallel, the controller 40 may control the measurement operation of the measuring mechanism 20 and the measurement operation of the measuring mechanism 50 in parallel, and acquire the measurement result of the measuring mechanism and the measurement result of the measuring mechanism 50 in parallel. When the measurement is performed sequentially, the controller 40 may sequentially control the measurement operation of the measuring mechanism 20 and the measurement operation of the measuring mechanism 50, and sequentially acquire the measurement result of the measuring mechanism 20 and the measurement result of the measuring mechanism 50. In this case, the controller 40 may limit the rotation range by performing the measurement of the edge position of the substrate by the measuring mechanism 20 to three or more edge positions arranged at substantially equal intervals, and the measurement of the edge position of the substrate by the measuring mechanism may be performed within the limited rotation range. Thus, the throughput of the pre-alignment process can be improved.

Figure 12:
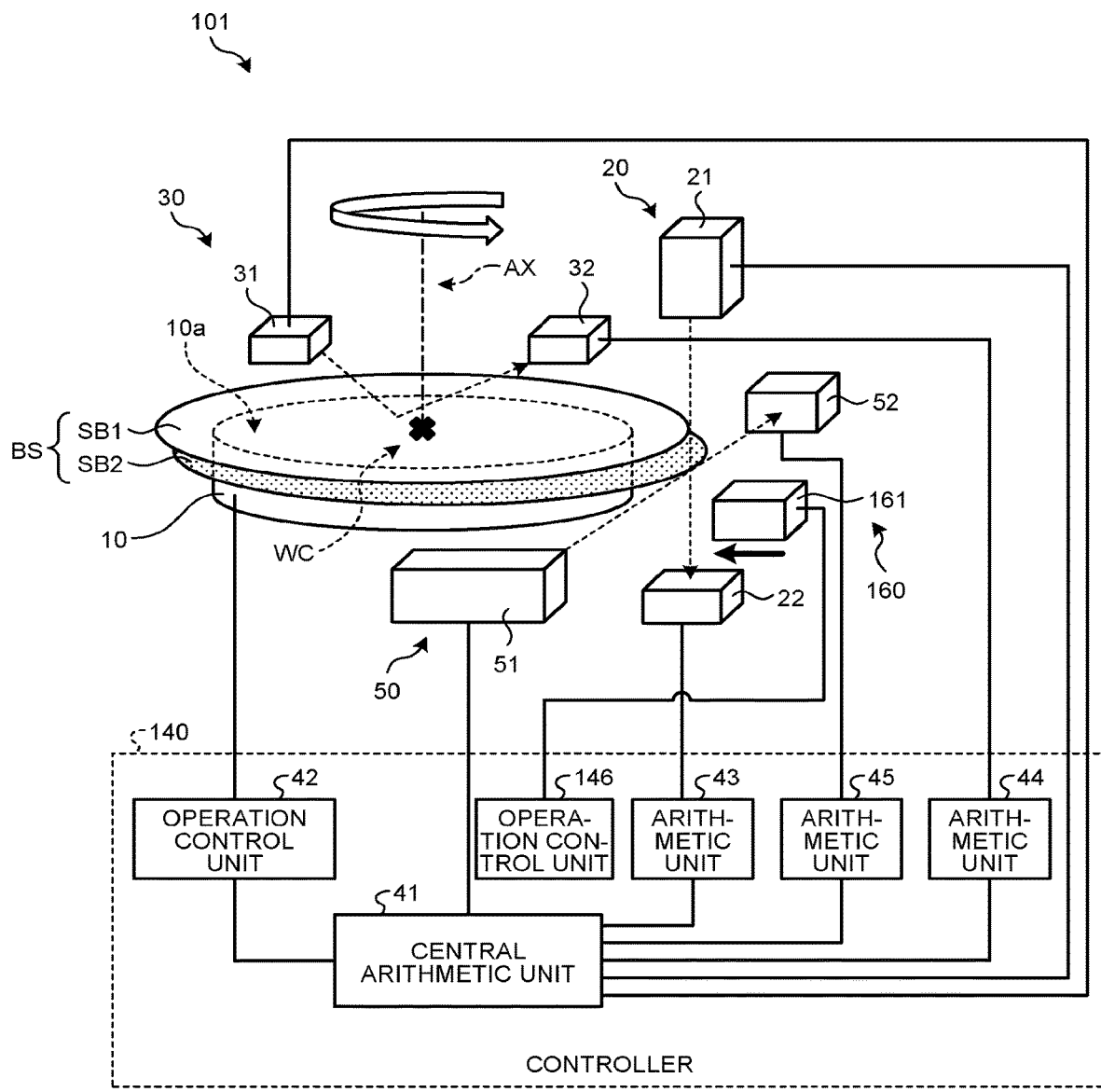
FIG. 12 is a diagram illustrating a configuration of a semiconductor manufacturing apparatus according to a first modification of the embodiment.

Alternatively, in the predetermined process (S7) illustrated in FIG. 11, the process of trimming the outer periphery of the laminated substrate BS may be performed. When the outer periphery of the laminated substrate BS is trimmed, the center of the laminated substrate BS may be newly determined so as not to destroy the device structure of the portion of the laminated substrate BS close to the outer peripheries of the substrates SB1 and SB2, and the process may be performed with the center aligned with the rotation center WC. In this case, as illustrated in FIG. 12, a semiconductor manufacturing apparatus 101 may further include a trimming mechanism 160. FIG. 12 is a diagram illustrating a configuration of the semiconductor manufacturing apparatus 101 according to a first modification of the embodiment.

The trimming mechanism 160 includes a trimming member 161. The trimming member 161 is a grinding stone or a dicing blade. The trimming member 161 may be arranged on the +X side with respect to the edges of the substrates SB1 and SB2. The trimming member 161 can be brought into contact with the edges of the substrates SB1 and SB2 from the +X side toward the −X direction.

The controller 140 further includes an operation control unit 146. In accordance with the control from the central arithmetic unit 41, the operation control unit 42 continuously rotates the substrate stage 10 about the rotation center WC (about the rotation axis AX) while the substrate stage 10 holds the laminated substrate BS. In accordance with the control from the central arithmetic unit 41, the operation control unit 146 brings the trimming member 161 into contact with the edges of the substrates SB1 and SB2 from the +X side toward the −X direction. Thus, the edges of the substrates SB1 and SB2 can be trimmed by the trimming member 161.

In this case, since the three centers, which are the rotation center WC of the substrate stage 10 and the centers SC1 and SC2 of the upper and lower substrates, hardly align with each other, one or both of the upper and lower substrates may be trimmed in an eccentric state. Thus, if one or both substrates are trimmed to the inside of the substrate more than expected when the trimming range of the outer periphery of the upper and lower substrates is considered, the device structure may be destroyed or the metal in the device structure may be exposed and the semiconductor manufacturing equipment may be contaminated. Alternatively, the substrate may be trimmed more outwardly than expected, and a chip without a device structure may be produced.

Figure 13:
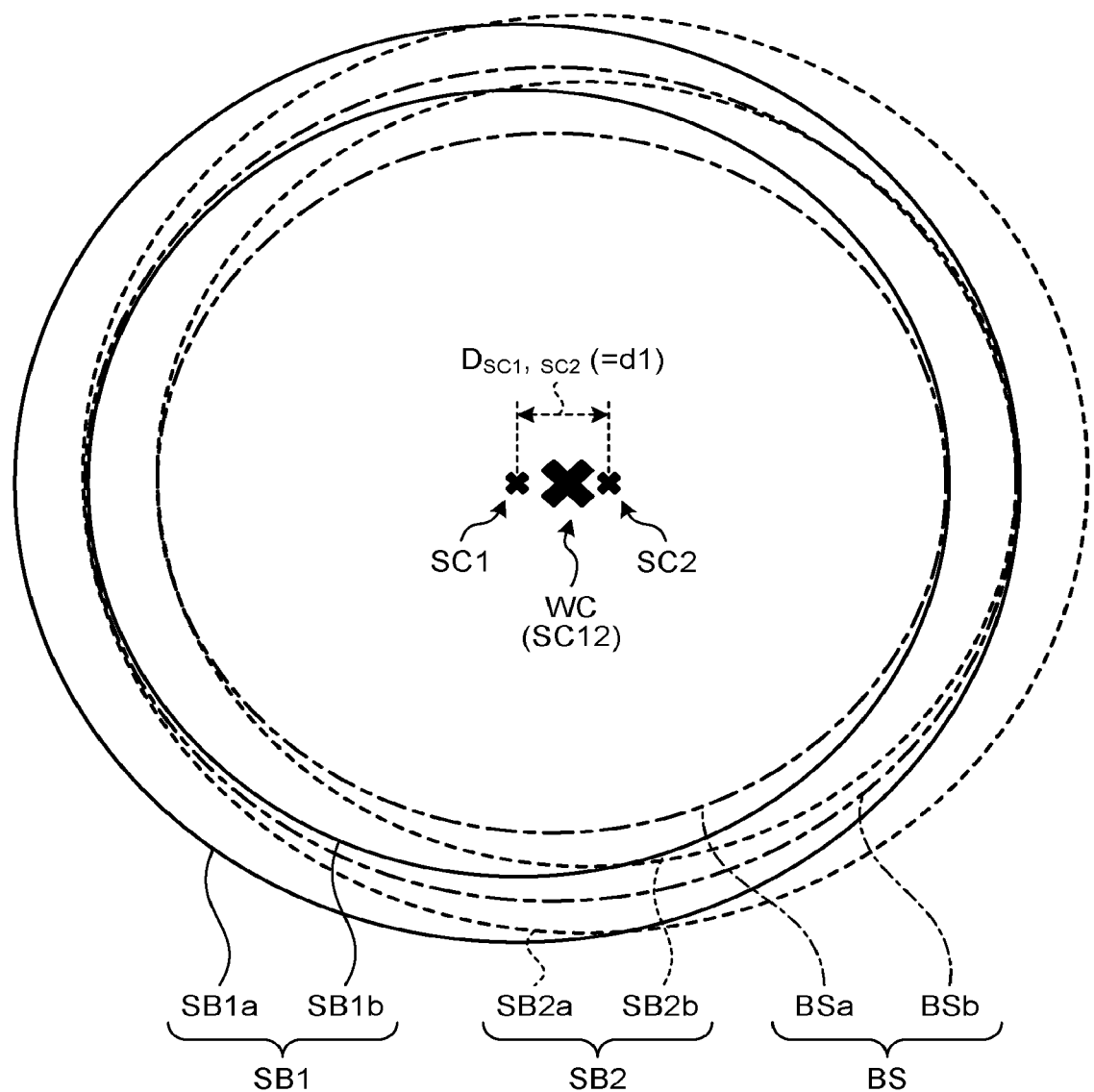
FIG. 13 is a diagram illustrating the center position of a laminated substrate in the first modification of the embodiment.
Figure 14:
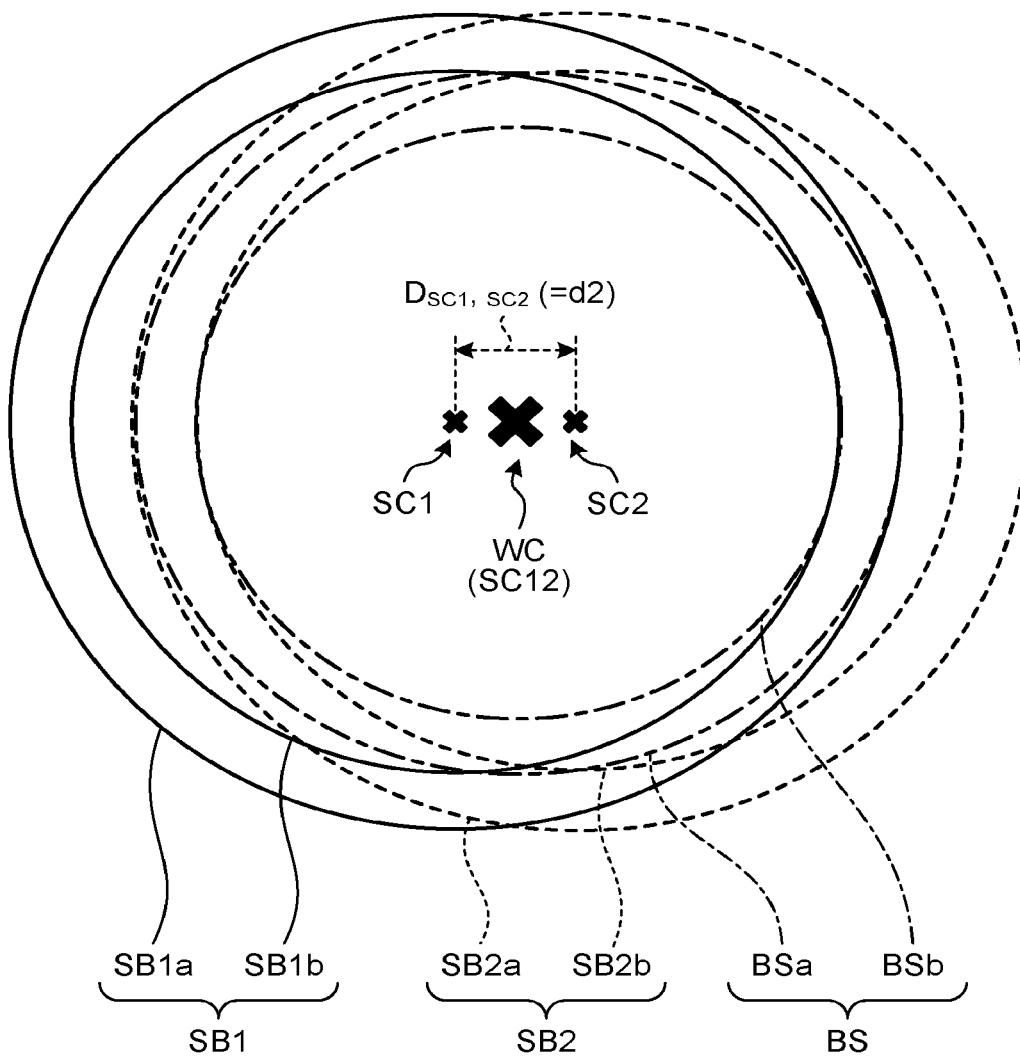
FIG. 14 is a diagram illustrating the center position of another laminated substrate in the first modification of the embodiment.

On the other hand, as illustrated in FIG. 13 or 14, the controller 140 newly defines a rotation center WC so as not to destroy the device structure in a portion near the edges of the substrates SB1 and SB2 when trimming the edges of the substrates SB1 and SB2. FIG. 13 is a diagram illustrating the center position of a laminated substrate. FIG. 14 is a diagram illustrating the center position of another laminated substrate.

FIG. 13 is a diagram illustrating the center position of a laminated substrate. In FIG. 13, an outer peripheral line SB1$a$ of an upper substrate SB1 and an outer peripheral line SB1$b$ of a pattern forming region are indicated by solid lines. The outer peripheral line SB1$b$ is positioned inside the outer peripheral line SB1$a$. An outer peripheral line SB2$a$ of a lower substrate SB2 and an outer peripheral line SB2$b$ of a pattern forming region are indicated by dotted lines. The outer peripheral line SB1$b$ is positioned inside the outer peripheral line SB1$a$. The controller 140 defines a center SC12 on a line connecting the center SC1 of the upper substrate SB1 and the center SC2 of the lower substrate SB2 at a position dividing the distance $D_{SC1,SC2}$ between the centers into two equal parts. The controller 140 then controls the center SC12 to be aligned with the rotation center WC so that the trimming process is performed. The trimming process allows the laminated substrate BS having the outer peripheral line BSa of the substrate and the outer peripheral line BSb of the pattern forming region, which are indicated by alternate long and short dash lines, to be formed so as to increase the area of the pattern forming region.

FIG. 14 is a diagram illustrating the center position of another laminated substrate. Although in the laminated substrate BS illustrated in FIG. 13, the distance $D_{SC1,SC2}$ between the center SC1 of the upper substrate SB1 and the center SC2 of the lower substrate SB2 is, for example, d1, in the laminated substrate BS illustrated in FIG. 14, the distance $D_{SC1,SC2}$ between the center SC1 of the upper substrate SB1 and the center SC2 of the lower substrate SB2 is, for example, d2, and thus the distance $D_{SC1,SC2}$ in FIG. 14 is different from that in FIG. 13.

In FIG. 14, the outer peripheral line SB1a of an upper substrate SB1 and the outer peripheral line SB1b of a pattern forming region are indicated by solid lines. The outer peripheral line SB1b is positioned inside the outer peripheral line SB1a. The outer peripheral line SB2a of the lower substrate SB2 and the outer peripheral line SB2b of the pattern forming region are indicated by dotted lines. The outer peripheral line SB1b is positioned inside the outer peripheral line SB1a. The controller 140 newly defines a midpoint SC12 between the center SC1 of the upper substrate SB1 and the center SC2 of the lower substrate SB2 as the center SC12 of the laminated substrate BS. The controller 140 defines a center SC12 at a position dividing the distance $D_{SC1,SC2}$ between the center SC1 the upper substrate SB1 and the center SC2 of the lower substrate SB2 into two equal parts. The controller 140 then controls the center SC12 to be aligned with the rotation center WC so that the trimming process is performed. The trimming process allows the laminated substrate BS having the outer peripheral line BSa of the substrate and the outer peripheral line BSb of the pattern forming region, which are indicated by alternate long and short dash lines, to be formed so as to increase the area of the pattern forming region.

As illustrated in FIGS. 13 and 14, defining the midpoint SC12 between the center SC1 of the upper substrate SB1 and the center SC2 of the lower substrate SB2 as the center SC12 of the laminated substrate BS allows the laminated substrate BS after the trimming process to be formed so as to increase the area of the pattern forming region.

Figure 15:
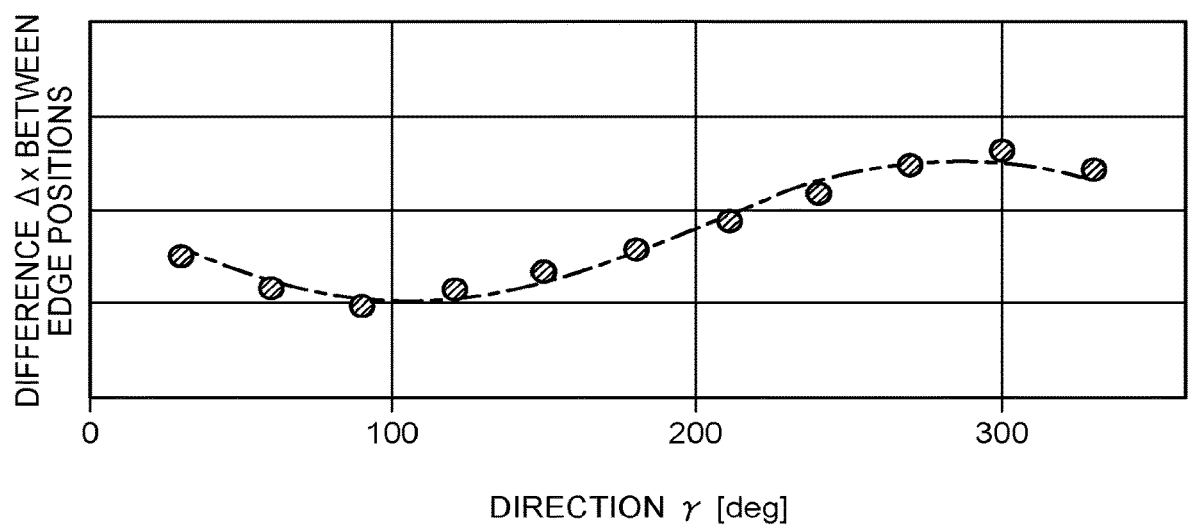
FIG. 15 is a diagram illustrating the relationship between the direction of a substrate and the edge position of a substrate in a second modification of the embodiment.

Alternatively, as illustrated in FIG. 15, in the pre-alignment process, the direction of the substrate may be measured by the measuring mechanism 20, and the difference Δx between the edge positions of the upper and lower substrates SB1 and SB2 may be measured by the measuring mechanism 50. FIG. 15 is a diagram illustrating the relationship between the direction of a substrate and the edge position of a substrate in a second modification of the embodiment.

In the difference Δx between the edge positions of the upper and lower substrates SB1 and SB2, as illustrated in FIG. 4B, the measuring mechanism 50 can measure the difference Δx between the edge positions of the upper and lower substrates SB1 and SB2 as the difference between the edge position of the +x side of the substrate SB1 and the edge position of the +x side of the substrate SB2. The controller 40 receives a plurality of pixel signals from the measuring mechanism 50, and generates received light intensity distribution data indicating a two-dimensional distribution of the received light intensity of the measurement light according to the received plurality of pixel signals. The controller 40 can obtain the difference Δx between the edge positions of the upper and lower substrates SB1 and SB2 of the laminated substrate BS according to the received light intensity distribution data.

The controller 40 also receives a plurality of pixel signals from the measuring mechanism 20, and generates received light intensity distribution data indicating a two-dimensional distribution of the received light intensity of the metering light according to the received plurality of pixel signals. The controller 40 can obtain the direction of the laminated substrate BS according to the received light intensity distribution data.

The controller 40 then generates information indicating a change in the difference Δx of the edge positions according to the direction of the laminated substrate BS as illustrated in FIG. 15. The controller 40 may generate the information in the form of a function as illustrated in Formula 7.

$$\Delta x = D_{SC1,SC2} \times \cos(\gamma - \gamma_0) + (R_{lower} - R_{upper}) \qquad \text{Formula 7}$$

In Formula 7, $D_{SC1,SC2}$ indicates the distance between the center SC1 of the upper substrate SB1 and the center SC2 of the lower substrate SB2, γ indicates the direction of the laminated substrate BS, and $\gamma_0$ indicates the direction when the lower substrate SB2 protrudes most in the + direction with respect to the upper substrate SB1. The controller 40 may obtain the $D_{SC1,SC2}$, $\gamma_0$, $R_{lower}$, or $R_{upper}$ by applying the measured values to Formula 7.

In this method, when the distance $D_{SC1,SC2}$ between the center SC1 of the upper substrate SB1 and the center SC2 of the lower substrate SB2 is greater than or equal to a predetermined value, the process can be interrupted.

In this way, the pre-alignment process can be easily performed by the method of the second modification of the embodiment.

Alternatively, in the embodiment, the distance between the center positions of the upper and lower substrates, and the radius are calculated. Thus, the shape in which the upper and lower substrates are misaligned is uniquely determined. In this case, whether the substrate is processed on the apparatus depends on whether the eccentricity of the substrate exceeds an allowable range for the subsequent process as described above. Therefore, in the process flow of the apparatus, for example, for the "distance between the center positions of the upper and lower substrates" according to the embodiment, a step is included in which a measured value is compared with a predetermined allowable range, a process is performed if the measured value is within the range, and a process is stopped if the measured value is outside the range. Thus, the manufacturing yield can be increased. Further, the substrate whose process is stopped can prevent waste by performing a rework process such as separating the upper and lower substrates and laminating the upper and lower substrates again.

Figure 16:
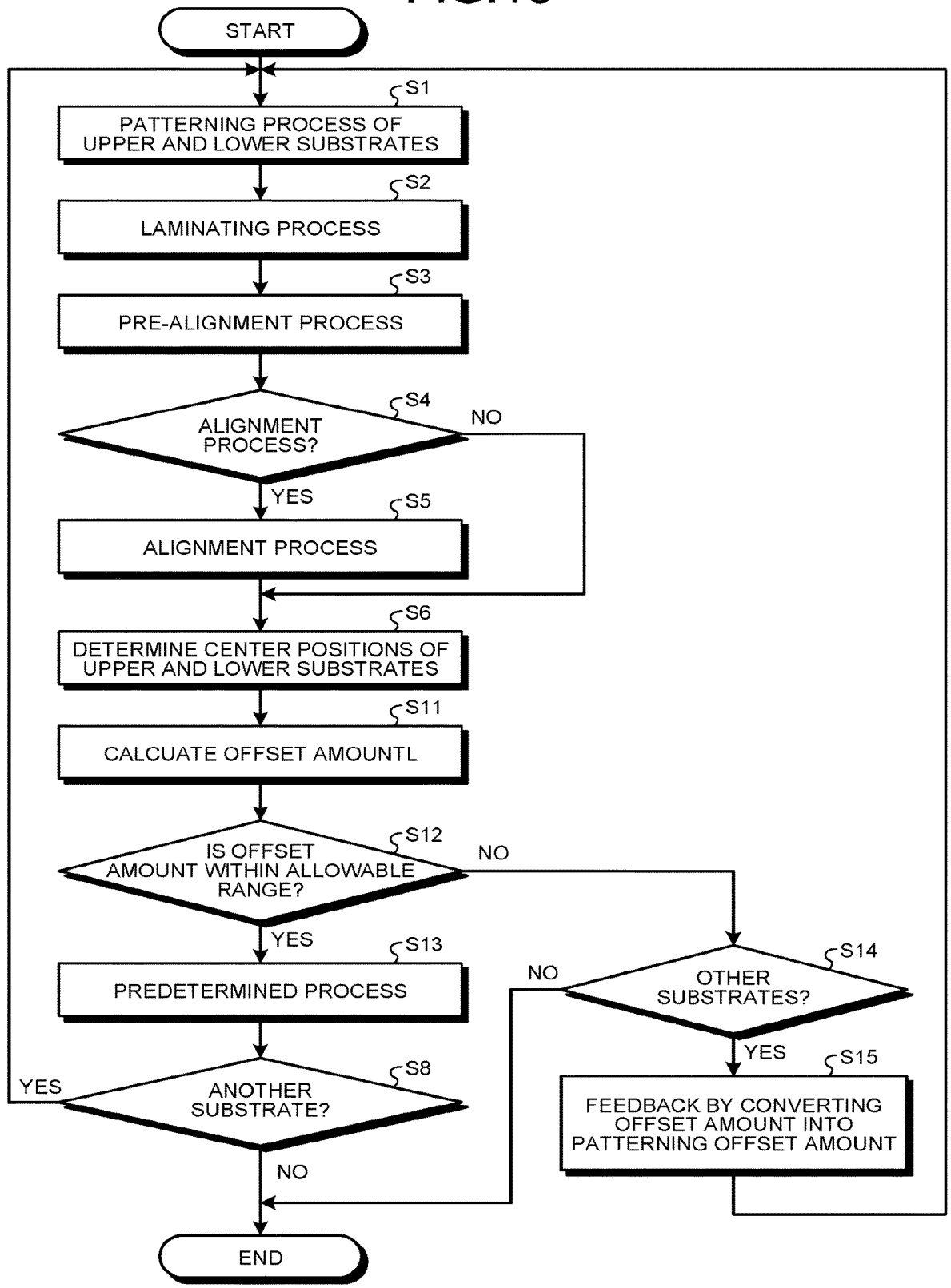
FIG. 16 is a flowchart illustrating a method of manufacturing a semiconductor device in a third modification of the embodiment.

In this case, the method of manufacturing the semiconductor device is different from the embodiment in the following points, as illustrated in FIG. 16.

After S1 to S6 are performed, in S11, from the result in S6, the offset amount $D_{SC1,SC2}$ to be given to the lower substrate SB2 in order to align the centers SC1 and SC2 of the upper and lower substrates SB1 and SB2, and the direction w1 of the lower substrate SB2 that is to be offset (the reference angle of 180° determined in FIG. 10 is replaced with a new reference angle of 0°) are calculated. Specifically, using the parameters calculated in the embodiment and the cosine theorem allows the offset amount $D_{SC1,SC2}$ to be calculated as indicated by the following Formula 8, and the direction w1 to be calculated as indicated by the following Formula 9.

$$D_{SC1,SC2} = \sqrt{(D_{ist\ upper}^2 + D_{ist\ lower}^2 - 2 \times D_{ist\ upper} \times D_{ist\ lower} \times \cos(Dir_{upper} - Dir_{lower}))} \qquad \text{Formula 8}$$

$$w1 = -(-\alpha_{lower}) + \delta \qquad \text{Formula 9}$$

In Formula 9, w1 represents an angle at which SC1 is seen from SC2. In the case that the angle at which WC is seen from SC2 is horizontal (0°), w1 reaches δ. δ is the value determined by Formula 10 using the cosine theorem. Practically, the angle at which WC is seen from SC2 is −(−$\alpha_{lower}$), and thus the angle obtained by adding −(−$\alpha_{lower}$) to δ is the desired direction w1.

$$\delta = \cos^{-1}\{(D_{SC1,SC2}^2 + D_{ist\ lower}^2 - D_{ist\ upper}^2)/(2 \times D_{SC1,SC2} \times D_{ist\ lower})\}$$ Formula 10

Note that in accordance with the second modification of the embodiment illustrated in FIG. 15, the $D_{SC1,SC2}$ and $\gamma_0$ are the offsets and their directions, and are obtained more directly.

In S12, whether the offset amount obtained in S11 is within the allowable range is determined. As an example, if the centers of the upper and lower substrates are aligned with an accuracy of about ±100 μm, an allowable range of ±100 μm is employed, and when the accuracy is within the range (Yes in S12), the substrate is processed (S13), and when the accuracy exceeds the range (No in S12), the substrate is not processed.

When the substrate is not processed, if there are not other substrates to be processed (No in S14), the process is terminated. If there are other substrates to be processed (Yes in S14), a parameter for applying feedback to the patterning process in S1 is obtained so as not to generate the offset amount (S15). For example, when the offset amount is 200 μm, the offset amount can be expected to be substantially zero by applying an offset amount of 200 μm to one of the upper and lower substrates or applying an offset amount of 100 μm equally to the upper and lower substrates and performing patterning process. Note that when the upper and lower substrates are laminated, one of the upper and lower substrates is inverted, and thus inverting the sign of the offset to be given to either the upper or lower substrate is not required, but a common value may be given.

In this way, according to the method of a third modification of the embodiment, when the centers of the upper and lower substrates are largely misaligned, the process can be stopped. Thus, the manufacturing yield of the laminated substrate and the laminated device can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
    a rotatable substrate stage on which a laminated substrate used for manufacturing a semiconductor device is placed, the laminated substrate being formed by a first substrate and a second substrate to be laminated to each other;
    a first measuring mechanism that measures an edge of the first substrate and an edge of the second substrate in a first direction;
    a second measuring mechanism that measures the edge of the first substrate and the edge of the second substrate in a second direction, the second direction being a direction different from the first direction in an angle to a normal of the first substrate; and
    a controller configured to determine a center position of the first substrate and a center position of the second substrate according to a measurement result of the first measuring mechanism and a measurement result of the second measuring mechanism.

2. The semiconductor manufacturing apparatus according to claim 1, wherein
    the first direction is a direction along the normal of a surface of the first substrate, and
    the second direction is a direction along the surface of the first substrate.

3. The semiconductor manufacturing apparatus according to claim 1, wherein
    the controller controls a measurement operation of the first measuring mechanism and a measurement operation of the second measuring mechanism in parallel, and acquires the measurement result of the first measuring mechanism and the measurement result of the second measuring mechanism in parallel.

4. The semiconductor manufacturing apparatus according to claim 1, wherein
    the controller sequentially controls a measurement operation of the first measuring mechanism and a measurement operation of the second measuring mechanism, and sequentially acquires the measurement result of the first measuring mechanism and the measurement result of the second measuring mechanism.

5. The semiconductor manufacturing apparatus according to claim 1, wherein
    the controller determines a center position of the laminated substrate according to the center position of the first substrate and the center position of the second substrate.

6. The semiconductor manufacturing apparatus according to claim 5, wherein
    the controller determines the center position of the first substrate or the center position of the second substrate to be the center position of the laminated substrate.

7. The semiconductor manufacturing apparatus according to claim 5, wherein
    the controller determines a midpoint between the center position of the first substrate and the center position of the second substrate to be the center position of the laminated substrate.

8. The semiconductor manufacturing apparatus according to claim 1, further comprising
    a trimming mechanism that trims at least one of an outer periphery of the first substrate and an outer periphery of the second substrate, wherein
    the controller determines a center position of the laminated substrate according to the center position of the first substrate and the center position of the second substrate, and controls the trimming mechanism according to the center position of the laminated substrate.

9. The semiconductor manufacturing apparatus according to claim 8, wherein
    the controller causes the trimming mechanism to trim an edge of the laminated substrate in a state where the center position of the laminated substrate aligns with a rotation center of the substrate stage.

10. The semiconductor manufacturing apparatus according to claim 1, wherein
    the controller obtains a distance between the center position of the first substrate and the center position of the second substrate according to the center position of the first substrate and the center position of the second substrate, and determines whether the distance is within an allowable range.

11. The semiconductor manufacturing apparatus according to claim 1, further comprising
a third measuring mechanism that measures a reference position on the first substrate in a third direction, the third direction being different from the first direction and the second direction in an angle to the normal of the first substrate.

12. A method of manufacturing a semiconductor device, comprising:
measuring an edge of a first substrate and an edge of a second substrate of a laminated substrate used for manufacturing a semiconductor device, the laminated substrate being formed by the first substrate and the second substrate to be laminated to each other;
determining a center position of the first substrate and a center position of the second substrate according to a result of the measuring; and
determining a center position of the laminated substrate according to the center position of the first substrate and the center position of the second substrate.

13. The method of manufacturing a semiconductor device according to claim 12, wherein
the measuring includes:
measuring the edge of the first substrate and the edge of the second substrate in a first direction; and
measuring, according to a result of the measuring in the first direction, the edge of the first substrate and the edge of the second substrate in a second direction, the second direction being different from the first direction in an angle to a normal of the first substrate.

14. The method of manufacturing a semiconductor device according to claim 13, wherein
the first direction is a direction along the normal of a surface of the first substrate, and
the second direction is a direction along the surface of the first substrate.

15. The method of manufacturing a semiconductor device according to claim 12, wherein
the determining the center position of the laminated substrate includes determining a midpoint between the center position of the first substrate and the center position of the second substrate to be the center position of the laminated substrate.

16. The method of manufacturing a semiconductor device according to claim 12, further comprising
trimming an edge of the laminated substrate according to the center position of the laminated substrate.

17. The method of manufacturing a semiconductor device according to claim 12, further comprising:
obtaining a lamination misalignment between the first substrate and the second substrate according to the center position of the first substrate and the center position of the second substrate; and
determining that the laminated substrate is processable according to the lamination misalignment within an allowable range, or determining that the laminated substrate is unprocessable according to the lamination misalignment outside the allowable range.

18. The method of manufacturing a semiconductor device according to claim 12, further comprising:
obtaining a lamination misalignment between the first substrate and the second substrate according to the center position of the first substrate and the center position of the second substrate; and
correcting a processing condition according to the lamination misalignment, and processing the laminated substrate under the corrected processing condition.

* * * * *